US012293991B2

(12) United States Patent
Yu et al.

(10) Patent No.: US 12,293,991 B2
(45) Date of Patent: *May 6, 2025

(54) SEMICONDUCTOR PACKAGES AND METHODS OF FORMING SAME

(71) Applicant: Taiwan Semiconductor Manufacturing Company, Ltd., Hsinchu (TW)

(72) Inventors: Chen-Hua Yu, Hsinchu (TW); Chih-Hang Tung, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 401 days.

This patent is subject to a terminal disclaimer.

(21) Appl. No.: 17/751,254

(22) Filed: May 23, 2022

(65) Prior Publication Data

US 2022/0285323 A1 Sep. 8, 2022

Related U.S. Application Data

(63) Continuation of application No. 16/927,265, filed on Jul. 13, 2020, now Pat. No. 11,342,309, which is a (Continued)

(51) Int. Cl.
*H01L 25/065* (2023.01)
*H01L 21/56* (2006.01)
(Continued)

(52) U.S. Cl.
CPC .......... *H01L 25/0657* (2013.01); *H01L 21/56* (2013.01); *H01L 21/568* (2013.01);
(Continued)

(58) Field of Classification Search
CPC .... H01L 25/0657; H01L 23/481; H01L 24/91
See application file for complete search history.

(56) References Cited

U.S. PATENT DOCUMENTS 6,828,669 B2   12/2004   Ijima et al.
7,547,625 B2    6/2009   Beyne et al.
(Continued)

FOREIGN PATENT DOCUMENTS

CN   105575930 A   5/2016
CN   106952833 A   7/2017
(Continued)

*Primary Examiner* — Dale E Page
*Assistant Examiner* — Wilner Jean Baptiste
(74) *Attorney, Agent, or Firm* — Slater Matsil, LLP

(57) ABSTRACT

In an embodiment, a package includes a first package structure including a first die having a first active side and a first back-side, the first active side including a first bond pad and a first insulating layer a second die bonded to the first die, the second die having a second active side and a second back-side, the second active side including a second bond pad and a second insulating layer, the second active side of the second die facing the first active side of the first die, the second insulating layer being bonded to the first insulating layer through dielectric-to-dielectric bonds, and a conductive bonding material bonded to the first bond pad and the second bond pad, the conductive bonding material having a reflow temperature lower than reflow temperatures of the first and second bond pads.

20 Claims, 52 Drawing Sheets

Related U.S. Application Data continuation of application No. 16/410,050, filed on May 13, 2019, now Pat. No. 10,714,457, which is a continuation of application No. 15/980,541, filed on May 15, 2018, now Pat. No. 10,290,611.

(60) Provisional application No. 62/537,736, filed on Jul. 27, 2017.

(51) Int. Cl.

| | | |
|---|---|---|
| *H01L 23/00* | (2006.01) | |
| *H01L 23/31* | (2006.01) | |
| *H01L 23/48* | (2006.01) | |
| *H01L 23/498* | (2006.01) | |
| *H01L 25/00* | (2006.01) | |
| *H01L 21/48* | (2006.01) | |
| *H01L 23/538* | (2006.01) | |
| *H01L 25/10* | (2006.01) | |

(52) U.S. Cl.
CPC ........ *H01L 23/3128* (2013.01); *H01L 23/481* (2013.01); *H01L 23/49827* (2013.01); *H01L 24/05* (2013.01); *H01L 24/09* (2013.01); *H01L 24/13* (2013.01); *H01L 24/14* (2013.01); *H01L 24/16* (2013.01); *H01L 24/17* (2013.01); *H01L 24/32* (2013.01); *H01L 24/49* (2013.01); *H01L 24/73* (2013.01); *H01L 24/91* (2013.01); *H01L 24/92* (2013.01); *H01L 25/50* (2013.01); *H01L 21/486* (2013.01); *H01L 23/49816* (2013.01); *H01L 23/5389* (2013.01); *H01L 24/29* (2013.01); *H01L 24/80* (2013.01); *H01L 24/81* (2013.01); *H01L 24/83* (2013.01); *H01L 25/105* (2013.01); *H01L 2224/02331* (2013.01); *H01L 2224/0401* (2013.01); *H01L 2224/04105* (2013.01); *H01L 2224/05005* (2013.01); *H01L 2224/05023* (2013.01); *H01L 2224/05025* (2013.01); *H01L 2224/05026* (2013.01); *H01L 2224/0508* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05164* (2013.01); *H01L 2224/05558* (2013.01); *H01L 2224/05568* (2013.01); *H01L 2224/05571* (2013.01); *H01L 2224/05573* (2013.01); *H01L 2224/0558* (2013.01); *H01L 2224/056* (2013.01); *H01L 2224/05624* (2013.01); *H01L 2224/05647* (2013.01); *H01L 2224/05655* (2013.01); *H01L 2224/05686* (2013.01); *H01L 2224/06102* (2013.01); *H01L 2224/06181* (2013.01); *H01L 2224/08111* (2013.01); *H01L 2224/08145* (2013.01); *H01L 2224/12105* (2013.01); *H01L 2224/13007* (2013.01); *H01L 2224/13021* (2013.01); *H01L 2224/13025* (2013.01); *H01L 2224/13082* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16058* (2013.01); *H01L 2224/16111* (2013.01); *H01L 2224/16147* (2013.01); *H01L 2224/16148* (2013.01); *H01L 2224/1703* (2013.01); *H01L 2224/17051* (2013.01); *H01L 2224/171* (2013.01); *H01L 2224/17181* (2013.01); *H01L 2224/27416* (2013.01); *H01L 2224/27436* (2013.01); *H01L 2224/2919* (2013.01); *H01L 2224/32145* (2013.01); *H01L 2224/48229* (2013.01); *H01L 2224/73103* (2013.01); *H01L 2224/73203* (2013.01); *H01L 2224/80896* (2013.01); *H01L 2224/80907* (2013.01); *H01L 2224/81191* (2013.01); *H01L 2224/81203* (2013.01); *H01L 2224/81815* (2013.01); *H01L 2224/83193* (2013.01); *H01L 2224/8385* (2013.01); *H01L 2224/9205* (2013.01); *H01L 2224/9211* (2013.01); *H01L 2224/9212* (2013.01); *H01L 2224/94* (2013.01); *H01L 2225/1058* (2013.01); *H01L 2924/00014* (2013.01); *H01L 2924/01013* (2013.01); *H01L 2924/01029* (2013.01); *H01L 2924/15311* (2013.01)

(56) References Cited

U.S. PATENT DOCUMENTS

| | | | |
|---|---|---|---|
| 7,741,714 B2 | 6/2010 | Huang et al. | |
| 8,860,229 B1 | 10/2014 | Lin | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,190,380 B2 | 11/2015 | Teh et al. | |
| 9,224,647 B2 | 12/2015 | Koo et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,633,924 B1 | 4/2017 | Yu et al. | |
| 9,773,768 B2 | 9/2017 | Yu et al. | |
| 9,935,072 B2 | 4/2018 | Jeong et al. | |
| 10,290,611 B2 * | 5/2019 | Yu | H01L 24/49 |
| 10,685,921 B2 * | 6/2020 | Jee | H01L 23/16 |
| 2009/0218702 A1 | 9/2009 | Beyne et al. | |
| 2014/0264948 A1 * | 9/2014 | Chou | H01L 23/53228 438/109 |
| 2014/0273347 A1 | 9/2014 | Tseng et al. | |
| 2015/0318246 A1 | 11/2015 | Yu et al. | |
| 2016/0133571 A1 | 5/2016 | Lee et al. | |
| 2016/0197055 A1 | 7/2016 | Yu et al. | |
| 2017/0084589 A1 | 3/2017 | Kuo et al. | |
| 2017/0117253 A1 | 4/2017 | Yu et al. | |
| 2017/0186732 A1 | 6/2017 | Chu et al. | |

FOREIGN PATENT DOCUMENTS

| | | |
|---|---|---|
| KR | 20160085197 A | 7/2016 |
| KR | 20170046557 A | 5/2017 |
| KR | 20170072105 A | 6/2017 |

* cited by examiner

SEMICONDUCTOR PACKAGES AND METHODS OF FORMING SAME

PRIORITY CLAIM AND CROSS-REFERENCE

This application is a continuation of U.S. application Ser. No. 16/927,265, filed on Jul. 13, 2020, entitled "Semiconductor Packages and Methods of Forming Same," which is a continuation of U.S. application Ser. No. 16/410,050, filed on May 13, 2019, entitled "Semiconductor Packages and Methods of Forming Same," now U.S. Pat. No. 10,714,457 issued on Jul. 14, 2020, which is a continuation of U.S. application Ser. No. 15/980,541, filed on May 15, 2018, entitled "Semiconductor Packages and Methods of Forming Same," now U.S. Pat. No. 10,290,611 issued on May 14, 2019, which claims the benefit of U.S. Provisional Application No. 62/537,736, filed on Jul. 27, 2017, entitled "Semiconductor Packages and Methods of Forming Same," which patent applications are incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
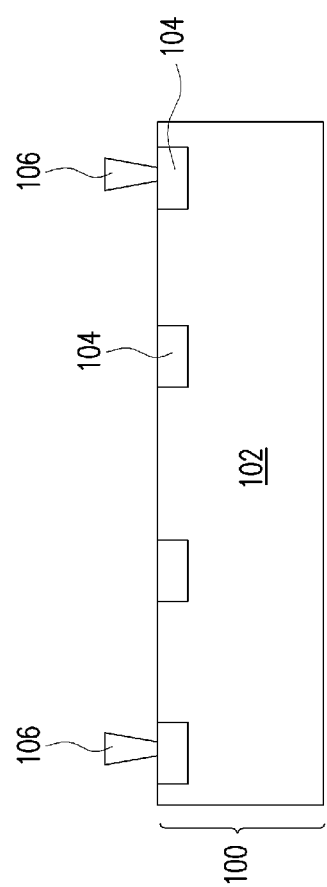
FIGS. 1 through 3, 4A-4O, and 5 through 14 illustrate cross-sectional of intermediate steps during a process for forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) including dies bonded together with a hybrid bonding technique. The dies can be bonded together face-to-face (F2F) or face-to-back (F2B). For example, in a F2F bonding configuration the active surfaces (faces) of the dies are bonded together, whereas in a F2B bonding configuration, an active surface of one die is bonded to a back surface of another die. In addition, the hybrid bonding between the dies includes a dielectric-to-dielectric bonding and a metal bonding. For example, by including a solder bonding (instead of, for example, copper to copper bonding), the bonding temperature of the hybrid bonding can be lowered significantly.

Further, the teachings of this disclosure are applicable to any package structure including one or more semiconductor dies. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 3, 4A-4O, and 5 through 14 illustrate cross-sectional of intermediate steps during a process for forming a package structure in accordance with some embodiments.

FIG. 1 illustrates an integrated circuit die 100 at an intermediate step in processing. The integrated circuit die 100 may be a logic die (e.g., central processing unit, mobile application processor, ASIC, GPU, FPGA, microcontroller, etc.), a memory die (e.g., dynamic random access memory (DRAM) die, a Wide I/O die, a M-RAM die, a R-RAM die, a NAND die, a static random access memory (SRAM) die, etc.), a memory cube (e.g. HBM, HMC, etc.), a high data rate transceiver die, a I/O interface die, a IPD die (e.g. integrated passives device), a power management die (e.g., power management integrated circuit (PMIC) die), a radio frequency (RF) die, a sensor die, a micro-electro-mechanical-system (MEMS) die, signal processing dies (e.g., digital signal processing (DSP) die), a front-end die (e.g., analog front-end (AFE) dies), a monolithic 3D heterogeneous chiplet stacking die, the like, or a combination thereof.

Before the intermediate step illustrate in FIG. 1, the integrated circuit die 100 may be processed according to applicable manufacturing processes to form integrated circuits in the integrated circuit die 100. For example, the integrated circuit die 100 includes a semiconductor substrate 102, such as silicon, doped or undoped, or an active layer of a semiconductor-on-insulator (SOI) substrate. The semiconductor substrate 102 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 102 and may be interconnected by interconnect structures formed by, for example, metallization patterns in one or more dielectric layers on the semiconductor substrate 102 to form an integrated circuit. The interconnect structures are formed using damascene and/or dual-damascene process, in some embodiments.

The integrated circuit die 100 further include pads 104, such as copper pads or aluminum pads, or a combination thereof to which external connections are made. In some embodiments, these pads 104 may be used in a hybrid bonding configuration to bond the integrated circuit die 100 to another die or structure. The pads 104 are on what may be referred to as an active side of the integrated circuit die 100. Insulating layers are also on the active side of the integrated circuit die 100. In some embodiments, the insulating layers are formed of a polymer, which may be a photo-sensitive material such as polybenzoxazole (PBO), polyimide, benzocyclobutene (BCB), or the like. In other embodiments, the insulating layers are formed of a nitride such as silicon nitride; an oxide such as silicon oxide, phosphosilicate glass (PSG), borosilicate glass (BSG), boron-doped phosphosilicate glass (BPSG); a combination thereof or the like. The insulating layers may be formed by spin coating, lamination, chemical vapor deposition (CVD), the like, or a combination thereof.

In some embodiments, the pads 104 may be referred to as die connectors 104 and may be conductive pillars (for example, comprising a metal such as copper). The pads 104 may be formed by, for example, metal deposition, plating, a combination thereof or the like. The active side of the integrated circuit die 100 (including pads 104 and insulating layers) may be planarized by a planarization process, such as a chemical mechanical polishing (CMP), to ensure planar surfaces for the subsequent bonding.

FIG. 1 further illustrates conductive pillars 106 formed on some of the pads 104. As illustrated the conductive pillars 106 may taper from the top to the bottom due to the high aspect ratio and relatively small dimensions of the pillars. The conductive pillars 106 will extend through the subsequently formed encapsulant 390 (see FIG. 6) and may be referred to as through vias 106 hereinafter. As an example to form the through vias 106, a seed layer is formed over the active side of the integrated circuit die, e.g., the interconnect and pads 104 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating, lamination or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, nickel, titanium, tungsten, aluminum, a combination thereof or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the through vias 106.

Figure 4A:
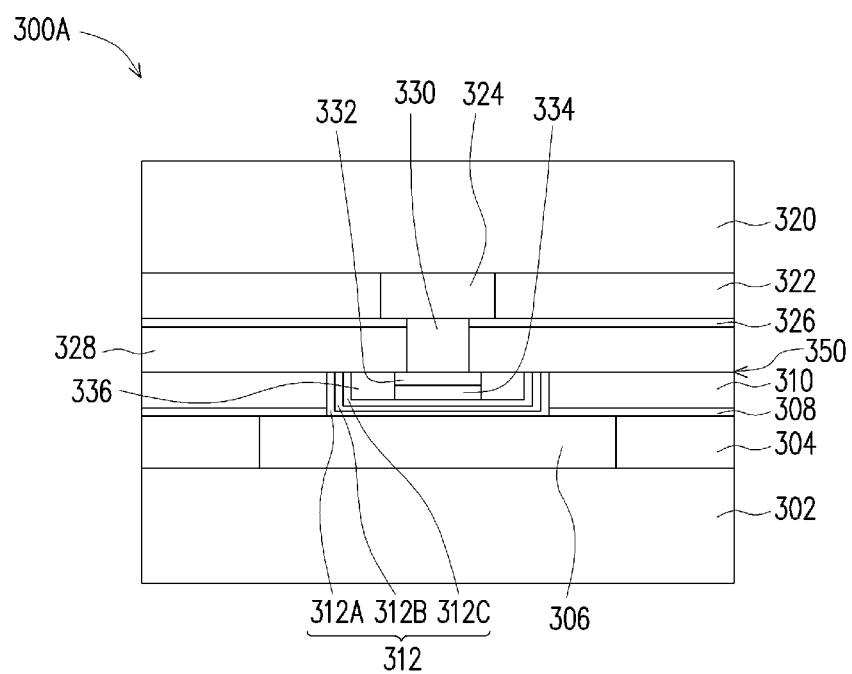

In some embodiments, the pads 104 with the conductive pillars 106 on them are formed with different configurations (e.g., the pads 104 with conductive pillars may not be recessed as shown, for example, by the recessed pad 312 in FIG. 4A) than the pads 104 without conductive pillars 106. In some embodiment, all of the pads 104 are formed with the same configuration.

Figure 2:
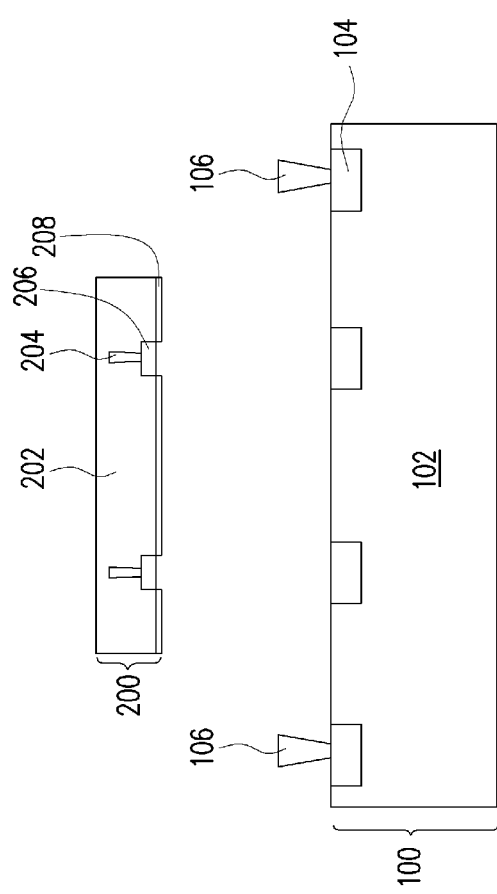

FIG. 2 illustrates an integrated circuit die 200 at an intermediate step in processing. The integrated circuit die 200 may be a logic die (e.g., central processing unit, ASIC, FPGA, microcontroller, etc.), a memory die (e.g., a DRAM die, a Wide I/O die, a M-RAM die, a R-RAM die, a NAND die, an SRAM die, etc.), a memory cube (e.g. HBM, HMC, etc.), a high data rate transceiver die, a I/O interface die, a IPD die (e.g. integrated passives device), a power management die (e.g., a PMIC die), an RF die, a sensor die, an MEMS die, signal processing dies (e.g., a DSP die), a front-end die (e.g., an AFE dies), a monolithic 3D heterogeneous chiplet stacking die, the like, or a combination thereof. In some embodiments, the integrated circuit die 100 is a logic die and the integrated circuit die 200 is a memory die.

Before the intermediate step illustrate in FIG. 2, the integrated circuit die 200 may be processed according to applicable manufacturing processes to form integrated circuits in the integrated circuit die 200. For example, the integrated circuit die 200 includes a semiconductor substrate 202, such as silicon, doped or undoped, or an active layer of a semiconductor-on-insulator (SOI) substrate. The semiconductor substrate 102 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 102 and may be interconnected by interconnect structures formed by, for example, metallization patterns in one or more dielectric layers on the semiconductor substrate 202 to form an integrated circuit. The interconnect structures are formed using damascene and/or dual-damascene process, in some embodiments.

The integrated circuit die 200 further includes through vias 204 and pads 206. The through vias 204 may extend through the semiconductor substrate 202 at this point in processing, or as illustrated in FIG. 2, may partially extend through the semiconductor substrate 202 at this point in processing. In the partial embodiment, the semiconductor substrate 202 may be thinned (see e.g., FIG. 11) such that the through vias 204 may extend through the semiconductor substrate 202. The through vias 204 may be formed, for example, by etching openings into the substrate 202 and then depositing a conductive material into the openings. These openings for the through vias 204 may all be formed simultaneously in a same process, or in separate processes. Openings into the substrate 202 may be formed using a suitable photolithographic mask and etching process. For example, a photoresist may be formed and patterned over the substrate 202, and one or more etching processes (e.g., a wet etch process or a dry etch process) are utilized to remove those portions of the substrate 202 where the through vias 204 are desired. The openings may be formed from the active side of the integrated circuit die 200 (i.e., lower side of integrated circuit die 200 in FIG. 2) by forming and patterning a mask on the active side of the integrated circuit die 200.

The openings may be filled with, e.g., a liner, such as a diffusion barrier layer, an adhesion layer, or the like, and a conductive material. The liner may include titanium, titanium nitride, tantalum, tantalum nitride, or the like. The liner may be formed using a chemical vapor deposition (CVD) process, such as a plasma enhanced CVD (PECVD). However, other alternative processes, such as sputtering or metal organic chemical vapor deposition (MOCVD), may be used. The conductive material of the through vias 204 may comprise one or more conductive materials, copper, a copper alloy, silver, gold, tungsten, aluminum, nickel, other conductive metals, a combination thereof or the like. The conductive material may be formed, for example, by depositing a seed layer (not shown) and using electroplating, electroless plating, or the like to deposit conductive material onto the seed layer, filling and overfilling the openings for the through vias 204. Once the openings for the through vias 204 have been filled, excess liner and excess conductive material outside of the openings for the through vias 204 may be removed through a grinding process such as chemical mechanical polishing (CMP), although any suitable removal process may be used. As one of ordinary skill in the art will recognize, the above described process for forming the through vias 204 is merely one method of forming the through vias 24, and other methods are also fully intended to be included within the scope of the embodiments. In some embodiments, the through vias 204 are formed from the back side of the integrated circuit die 200.

Although two through vias 204 are illustrated in the integrated circuit die 200, it should be appreciated that there may be more or less through vias 204 in each integrated circuit die 200.

The pads 206 may be copper pads or aluminum pads or a combination thereof to which external connections are made. In some embodiments, these pads 206 may be used in a hybrid bonding configuration to bond the integrated circuit die 200 to another die or structure. The pads 206 are on what may be referred to as the active side of the integrated circuit die 200. The pads 206 may be formed on and electrically coupled to the through vias 204. One or more insulating layers 208 are also on the active side of the integrated circuit die 200. The insulating layers 208 may be inorganic or organic layers. In some embodiments, the insulating layers 208 are formed of a polymer, which may be a photosensitive material such as PBO, polyimide, BCB, or the like. In other embodiments, the insulating layers 208 are formed of a nitride such as silicon nitride; an oxide such as silicon oxide, PSG, BSG, BPSG; or the like. The insulating layers 208 may be formed by spin coating, lamination, CVD, the like, or a combination thereof. The active side of the integrated circuit die 200 (including pads 206 and insulating layers 208) may be planarized by a planarization process, such as a CMP, to ensure planar surfaces for the subsequent bonding.

In some embodiments, the pads 206 may be referred to as die connectors 206 and may be conductive pillars or vias (for example, comprising a metal such as copper, aluminum, a combination thereof). The pads 206 may be formed by, for example, plating, or the like. In some embodiments, either one or both of the pads 104 and 206 include a solder material to be utilized when joining the integrated circuit dies 100 and 200. This structure will be described in more detail in FIGS. 4A-4O.

Figure 3:
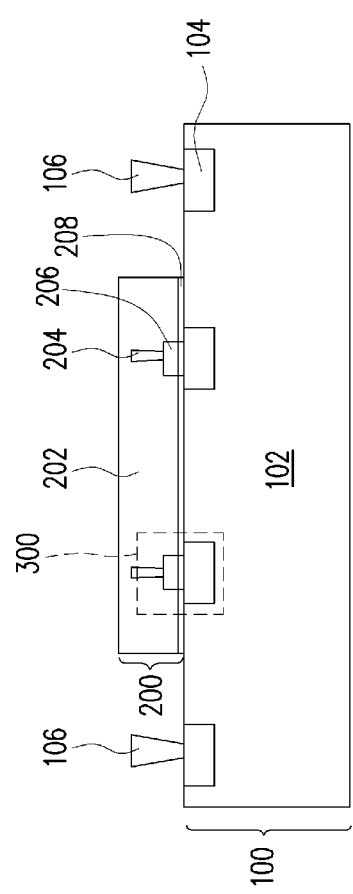

FIG. 3 illustrates the integrated circuit die 200 bonded to the integrated circuit die 100 through hybrid bonding. To achieve the hybrid bonding, the integrated circuit dies 100 and 200 are first pre-bonded by their insulating layers on their active sides (e.g., 208) by lightly pressing the integrated circuit dies 100 and 200 together. Although one integrated circuit die 100 and one integrated circuit die 200 are illustrated, the hybrid bonding may be performed at wafer level (e.g. chip on wafer or wafer on wafer), wherein there are multiple the integrated circuit die 100 formed in a wafer and there are multiple integrated circuit dies 200 identical to the illustrated integrated circuit die 200 are pre-bonded, and arranged as rows and columns on the wafer.

After all of the integrated circuit dies 100 and 200 are pre-bonded, a reflow process is performed to cause the reflow of the solder (i.e., solder material between the pads 104 and 206) and inter-diffusion of the solder and of the metals in at least one of the pads 104 and 206. The reflow temperature may be lowered to lower than about 200° C. in order to avoid the damage of the insulating layers and bonding dies. For example, the reflow temperature may be in the range between about 150° C. and about 200° C. The annealing time may be between about 2 hours and 3 hours. In accordance of some embodiment, a thermal compression bond (TCB) may be applied to locally heat up the bonding interfaces to reduce the bonding time and the thermomechanical stress at the bonding joints due to a mismatch of coefficient of thermal expansion (CTE) among top circuit die, bottom circuit die, and bonding tool.

Through the hybrid bonding, the pads 104 and 206 are bonded to each other through solder bonding to form a bonding joint 300. The insulating layer of the integrated circuit die 100 is also bonded to the insulating layer 208, with bonds formed therebetween. For example, the atoms (such as oxygen atoms) in one of the insulating layers form chemical or covalent bonds (such as O—H bonds) with the atoms (such as hydrogen atoms) in the other one of the insulating layers. The resulting bonds between the insulating layers are dielectric-to-dielectric bonds, which may be inorganic-to-polymer, polymer-to-polymer, or inorganic-to-inorganic bonds in accordance with various embodiments. Furthermore, the surface insulating layers of two integrated circuit dies 100 and/or 200 may be different from each other (for example, with one being a polymer layer and the other being an inorganic layer), and hence there may be two types of inorganic-to-polymer, polymer-to-polymer, and inorganic-to-inorganic bonds existing simultaneously in the same package.

FIGS. 4A, 4B, 4C, 4D, 4E, 4F, 4G, 4H, 4I, 4J, 4K, 4L, 4M, 4N, and 4O illustrate detailed views of different configurations of a bonding joint 300 from FIG. 3. In each of the illustrated configurations, the integrated circuit dies 100 and 200 could be either the top example die (i.e., die above bonding interface 350) in FIGS. 4A-4O or the bottom example die (i.e., die below bonding interface 350) in FIGS. 4A-4O.

FIG. 4A illustrates a bonding joint configuration 300A with dielectric bonding and a recessed bonding pad. In FIG. 4A, a first die includes a semiconductor substrate 302, dielectric layers 304, 308, and 310 on the semiconductor substrate 302, a metallization layer 306 in the dielectric layer 304, and a recessed bond pad 312 in the dielectric layer 310 and on the metallization layer 306. In FIG. 4A, a second die includes a semiconductor substrate 320, dielectric layers 322, 326, and 328 on the semiconductor substrate 320, a metallization layer 324 in the dielectric layer 322, a bond pad 330 in the dielectric layer 328 and on the metallization layer 324, and a protruded bump including layers 332 and 334. Interface 350 illustrates the bonding interface between the dielectric layers 310 and 328.

In this embodiment, the dielectric layers 304, 308, 310, 322, 326, and 328 are formed of a nitride such as silicon nitride; an oxide such as silicon oxide, PSG, BSG, BPSG; or the like. The dielectric layers 308 and 326 may be utilized as etch stop layers when forming the bond pads 312 and 330 on the respective dies and may be made from a different material composition than the surrounding dielectric layers. The surfaces of the dielectric layers 310 and 328 at the bonding interface 350 (including their respective conductive features 330 and 312) may be planarized by a planarization process, such as a CMP, to ensure planar surfaces for the bonding.

The metallization layers 306 and 324 and bond pad 330 may be formed a conductive material may comprise a metal, like copper, titanium, tungsten, aluminum, or the like. The conductive material may be formed by plating, such as electroplating or electroless plating, sputtering, or the like. These structures may be formed by a damascene process and may include a diffusion barrier layer, an adhesion layer, or the like, a seed layer, and a conductive material. The diffusion barrier layer and/or adhesion layer may include titanium, titanium nitride, tantalum, tantalum nitride, or the like. The diffusion barrier layer and/or adhesion layer may be formed using a CVD process, such as a PECVD. However, other alternative processes, such as sputtering or MOCVD, may be used. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like.

The recessed bond pad 312 may include multiple layers formed in the recess of the dielectric layer 310. The layers may include a seed layer 312A, a diffusion barrier layer 312B, and a conductive material layer 312C. In addition, there may be a diffusion barrier layer and/or an adhesion layer between the seed layer 312A and the dielectric layer 310.

The diffusion barrier layer and/or adhesion layer may include titanium, titanium nitride, tantalum, tantalum nitride, or the like. The diffusion barrier layer and/or adhesion layer may be formed using a CVD process, such as a PECVD. However, other alternative processes, such as sputtering or MOCVD, may be used.

In some embodiments, the seed layer 312A is a metal layer, which may be a single layer or a composite layer comprising a plurality of sub-layers formed of different materials. In some embodiments, the seed layer 312A comprises a titanium layer and a copper layer over the titanium layer. The seed layer 312A may be formed using, for example, PVD or the like.

In some embodiments, the diffusion barrier layer 312B comprises a layer of nickel. The diffusion barrier layer 312B may be formed using, for example, PVD or the like. The diffusion barrier layer 312B provides diffusion protection such that the solder material 334 does not diffuse into the metallization layer 306. Other materials may be used in the place of the diffusion barrier as long as they provide an appropriate amount of diffusion protection.

The conductive material layer 312C may comprise one or more conductive materials, copper, a copper alloy, silver, gold, tungsten, aluminum, nickel, other conductive metals, or the like. The conductive material layer 312C may be formed, for example, by electroplating, electroless plating, or the like to deposit a conductive material. The layers 312A, 312B, and 312C of the bond pad 312 do not fill the recess in the dielectric layer 310 such that the bond pad 312 is recessed in the dielectric layer 310. This recessed bond pad 312 can allow for a thinner package by reducing the standoff of the bonded package. After the formation of the conductive material layer 312C, excess portions of the layers 312A, 312B, and 312C outside of the recess (e.g., along an upper surface of dielectric layer 310 before the dies are bonded) may be removed through a grinding process such as CMP. In this embodiment, the combined thickness of the layers 312A, 312B, and 312C is less than the thickness of the dielectric layer 310.

The bump layers 332 and 334 include a diffusion barrier layer 332 and a solder layer 334. The diffusion barrier layer 332 may be formed on the bond pad 330. In some embodiments, the diffusion barrier layer 332 comprises a layer of nickel. The diffusion barrier layer 332 may be formed using, for example, PVD or the like. The diffusion barrier layer 332 provides diffusion protection such that the solder material 334 does not diffuse into the pad/via 330. Other materials may be used in the place of the diffusion barrier as long as they provide an appropriate amount of diffusion protection.

The solder layer 334 may be formed on the diffusion barrier layer 332. The solder layer 334 may be formed of a solder material including copper, aluminum, gold, nickel, silver, palladium, tin, the like, or a combination thereof. The solder layer 334 may be formed by evaporation, electroplating, printing, solder transfer, ball placement, or the like. The solder layer 334 is bonded to the recessed bond pad through a solder reflow process (described in detail above) or a thermal compression bond process. The solder layer 334 has a lower reflow temperature than both the conductive material layer 312C of the bond pad 312 and the pad/via 330. This allows for a lower reflow temperature to be used when bonding the dies together.

As illustrated, the bonding joints 300A-3300 of FIGS. 4A-4O include a void or gap 336 surrounding the solder layer 334 and between the bond pad 312 and the dielectric layer 322/328. This void/gap 336 can remain unfilled and be visible in the final product.

Figure 4B:
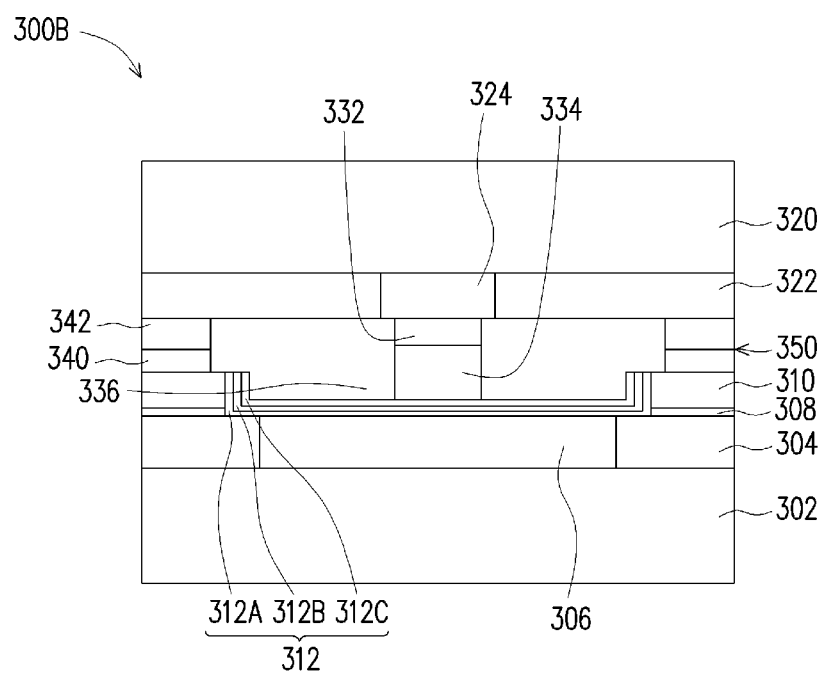

FIG. 4B illustrates another configuration 300B of the bonding joint 300 of FIG. 3. This embodiment is similar to the previous embodiment of FIG. 4A except that in this embodiment, the bonding interface 350 includes polymer layers 340 and 342 instead of dielectric layers and thus it includes polymer bonding. Details regarding this embodiment that are similar to those for the previously described embodiment will not be repeated herein.

In this embodiment, each of the dies includes a polymer layer as the bonding layer. The polymer layer 340 is formed on the first die and the polymer layer 342 is formed on the second die. The polymer layers 340 and 342 may be a photo-sensitive material such as PBO, polyimide, BCB, or the like. The polymer layers 340 and 342 may be formed by spin coating, lamination, the like, or a combination thereof.

Figure 4C:
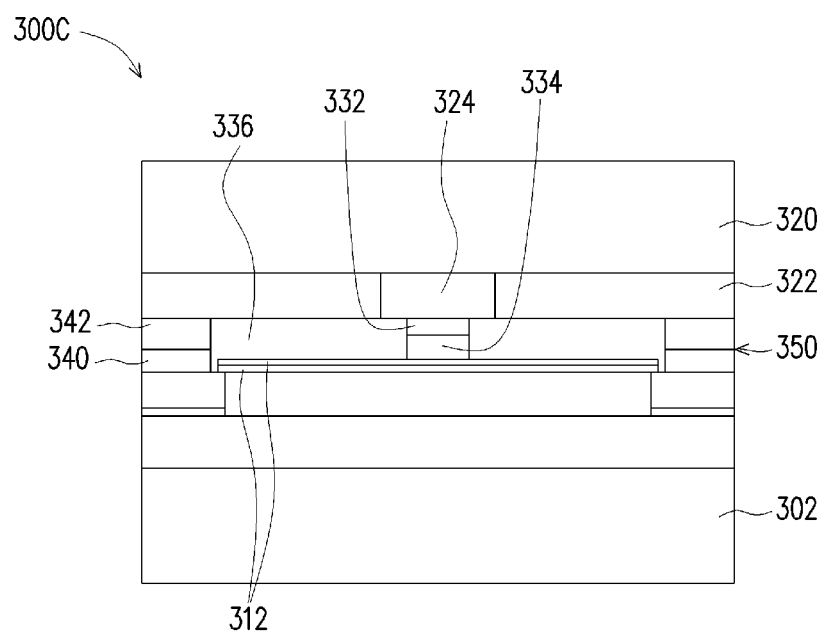

FIG. 4C illustrates another configuration 300C of the bonding joint 300 of FIG. 3. This embodiment is similar to the previous embodiment of FIG. 4B except that in this embodiment, the bond pad 312 is not recessed into an insulating layer. Details regarding this embodiment that are similar to those for the previously described embodiment will not be repeated herein.

In this embodiment, the bond pad 312 is not recessed but is substantially planar across the metallization layer 306. The polymer layer 340 extends above the upper surface of the bonding pad 312 and the polymer layer 342 extends from the dielectric layer 322 of the second die such that the bump layers 332 and 334 have space between the bonding pad 312 and the pad/via 324.

Figure 4D:
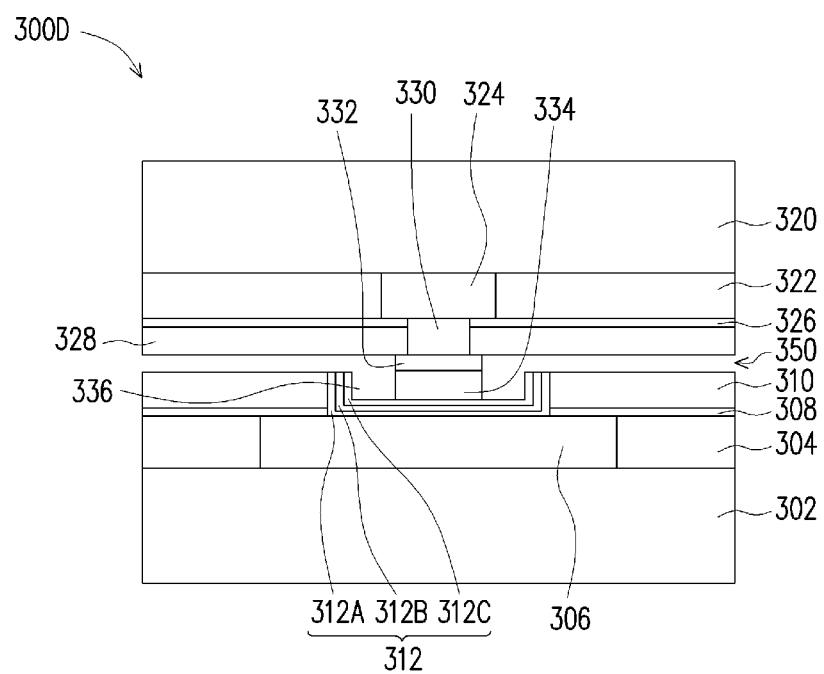

FIG. 4D illustrates another configuration 300D of the bonding joint 300 of FIG. 3. This embodiment is similar to the previous embodiment of FIG. 4A except that in this embodiment, the bonding interface 350 is a solder bonding but not a dielectric bonding as the dielectric layers 310 and 328 are separated from each other. Details regarding this embodiment that are similar to those for the previously described embodiment will not be repeated herein.

In this embodiment, the dielectric layers 310 and 328 of the dies are spaced apart from each other after the bonding process. This embodiment is not necessarily ideal as the standoff height is greater and the bonding strength may be reduced as compared to the other embodiments.

Figure 4E:
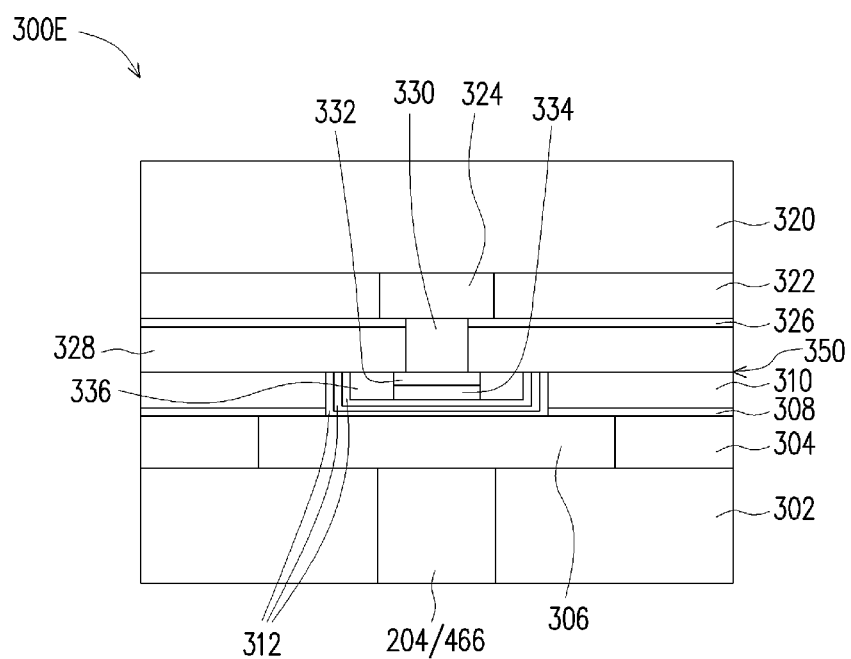

FIG. 4E illustrates another configuration 300E of the bonding joint 300 of FIG. 3. This embodiment is similar to the previous embodiment of FIG. 4A except that in this embodiment, the metallization layer 306 is over and electrically coupled to through via 204/through via 466 (see FIG. 15 for 466). Details regarding this embodiment that are similar to those for the previously described embodiment will not be repeated herein.

In this embodiment, the through via 204/through via 466 is formed through one of the integrated circuit dies 100 and/or 200.

Figure 4F:
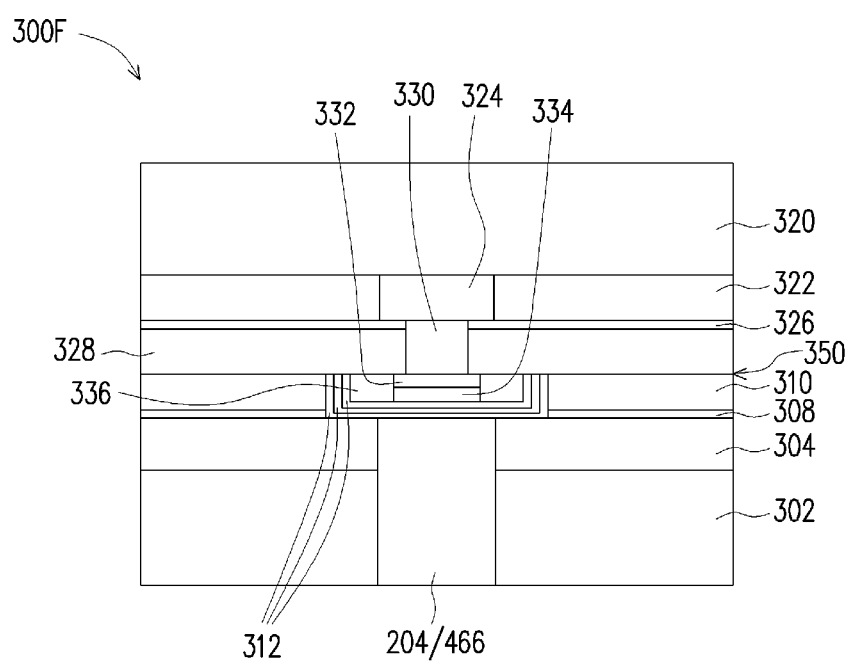

FIG. 4F illustrates another configuration 300F of the bonding joint 300 of FIG. 3. This embodiment is similar to the previous embodiment of FIG. 4E except that in this embodiment, the metallization layer 306 is omitted and the through via 204/through via 466 is directly coupled to the recessed pad 312. Details regarding this embodiment that are similar to those for the previously described embodiment will not be repeated herein.

In this embodiment, the width of the through via 204/through via 466 adjoining the recessed pad 312 is less than the width of the recessed pad 312.

Figure 4G:
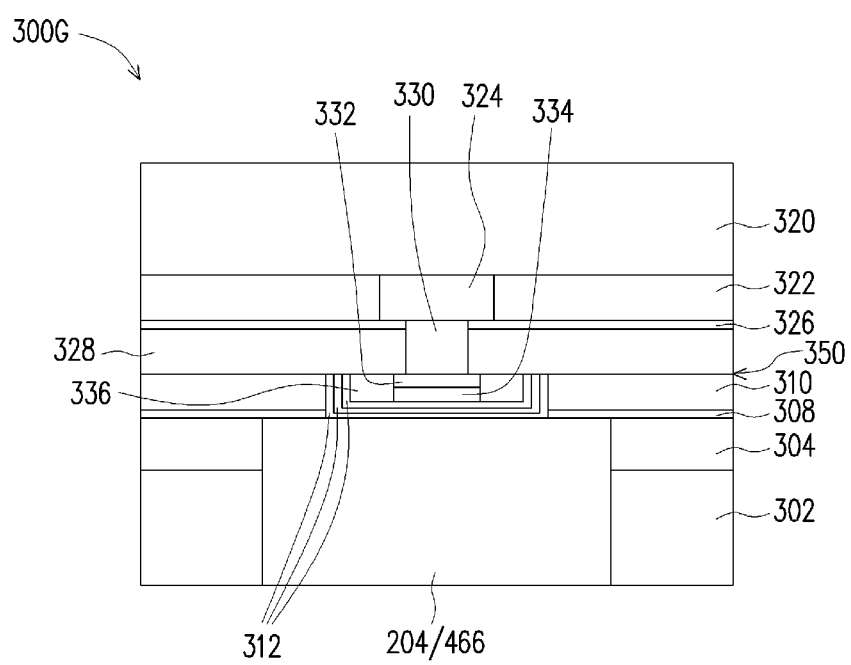

FIG. 4G illustrates another configuration 300G of the bonding joint 300 of FIG. 3. This embodiment is similar to the previous embodiment of FIG. 4F except that in this embodiment, the width of the through via 204/through via 466 adjoining the recessed pad 312 is greater than the width of the recessed pad 312. Details regarding this embodiment that are similar to those for the previously described embodiment will not be repeated herein.

Figure 4H:
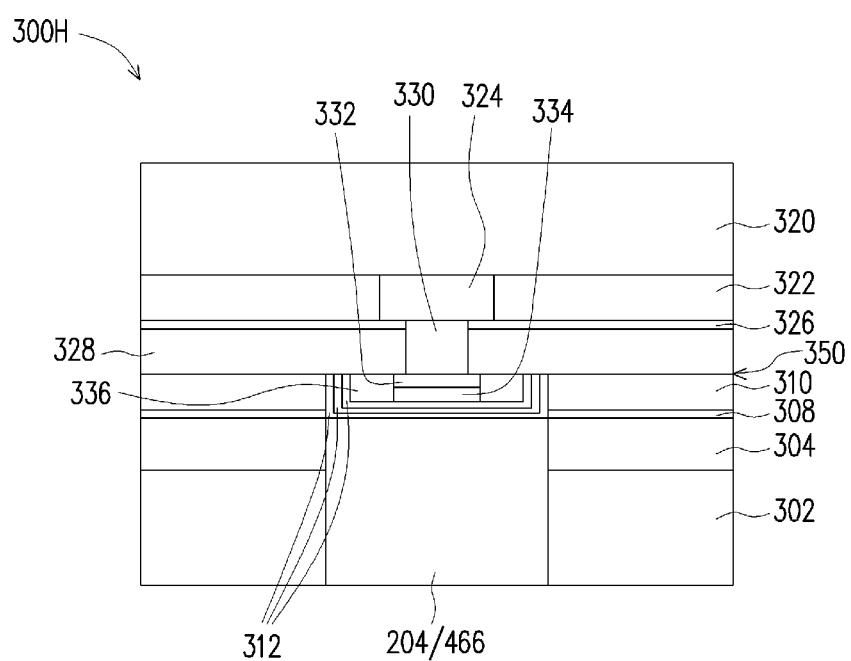

FIG. 4H illustrates another configuration 300H of the bonding joint 300 of FIG. 3. This embodiment is similar to the previous embodiment of FIG. 4F except that in this embodiment, the width of the through via 204/through via 466 adjoining the recessed pad 312 is equal to the width of the recessed pad 312. Details regarding this embodiment that are similar to those for the previously described embodiment will not be repeated herein.

Figure 4I:
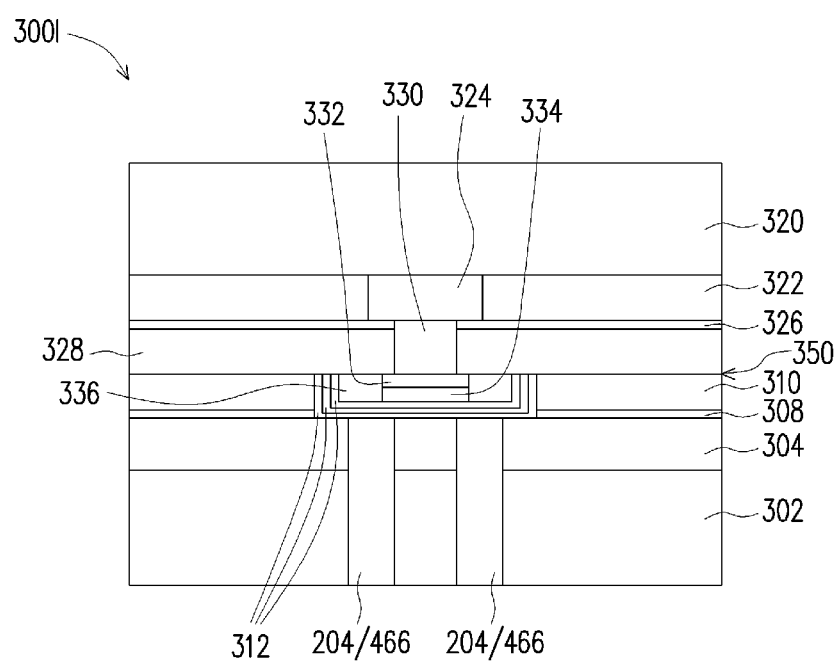

FIG. 4I illustrates another configuration 300I of the bonding joint 300 of FIG. 3. This embodiment is similar to the previous embodiment of FIG. 4F except that in this embodiment, there is more than one through via 204/through via 466 adjoining the recessed pad 312. Details regarding this embodiment that are similar to those for the previously described embodiment will not be repeated herein.

Figure 4J:
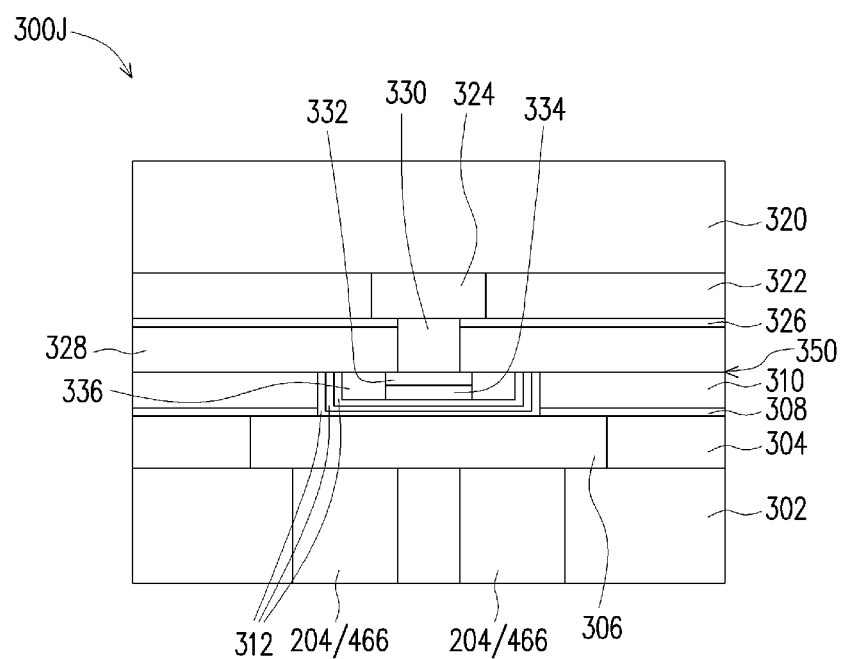

FIG. 4J illustrates another configuration 300J of the bonding joint 300 of FIG. 3. This embodiment is similar to the previous embodiment of FIG. 4E except that in this embodiment, there is more than one through via 204/through via 466 adjoining the recessed pad 312. Details regarding this embodiment that are similar to those for the previously described embodiment will not be repeated herein.

Figure 4K:
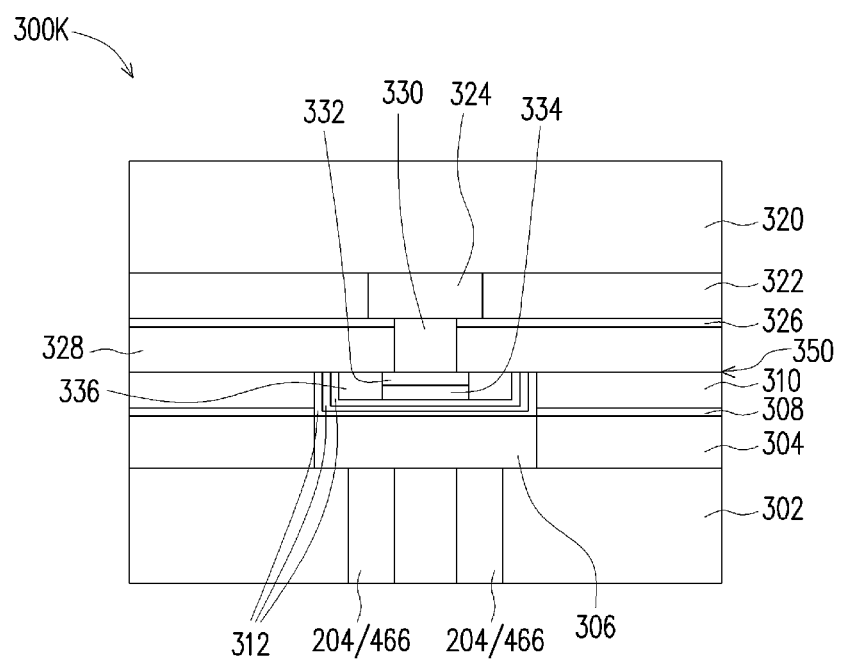

FIG. 4K illustrates another configuration 300K of the bonding joint 300 of FIG. 3. This embodiment is similar to the previous embodiment of FIG. 4J except that in this embodiment, the width of the through via 204/through via 466 adjoining the recessed pad 312 is equal to the width of the recessed pad 312. Details regarding this embodiment that are similar to those for the previously described embodiment will not be repeated herein.

Figure 4L:
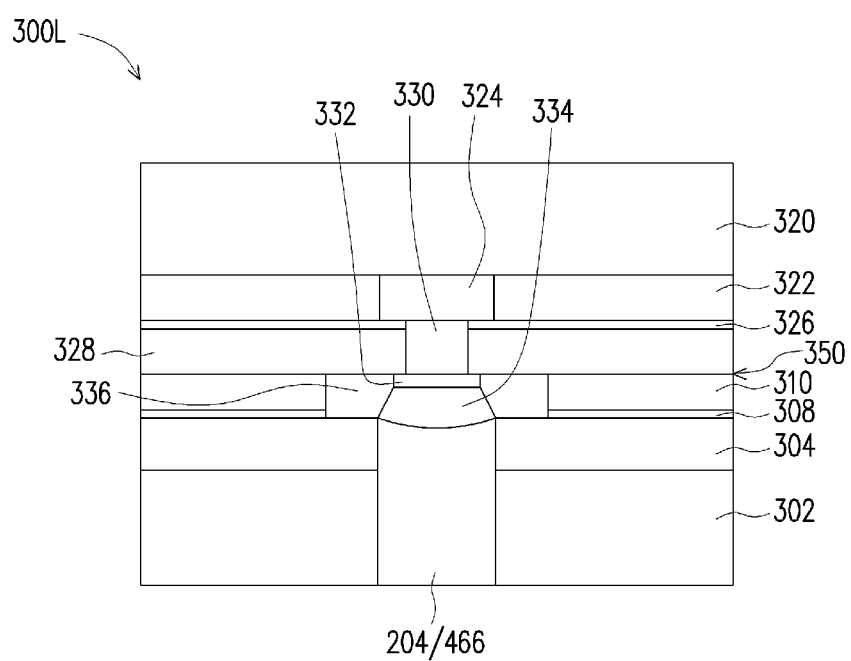

FIG. 4L illustrates another configuration 300L of the bonding joint 300 of FIG. 3. This embodiment is similar to the previous embodiment of FIG. 4F except that in this embodiment, the recessed pad 312 is omitted and solder material 334 is directly coupled to the through via 204/through via 466. Details regarding this embodiment that are similar to those for the previously described embodiment will not be repeated herein.

In this embodiment, the through via 204/through via 466 may be recessed such that some portion of the solder material 334 extend below a topmost surface of the through via 204/through via 466 and/or the surface of the dielectric layer 304. In some embodiments, the width of the void 336 is greater than the width of through via 204/through via 466 adjoining the solder material 334.

Figure 4M:
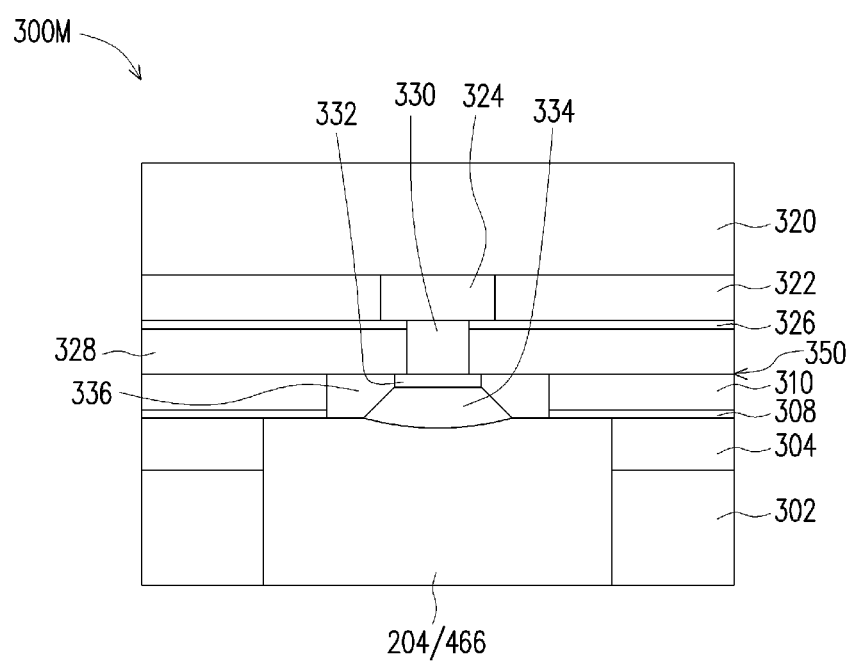

FIG. 4M illustrates another configuration 300M of the bonding joint 300 of FIG. 3. This embodiment is similar to the previous embodiment of FIG. 4L except that in this embodiment, the width of the void 336 is less than the width of through via 204/through via 466 adjoining the solder material 334. Details regarding this embodiment that are similar to those for the previously described embodiment will not be repeated herein.

Figure 4N:
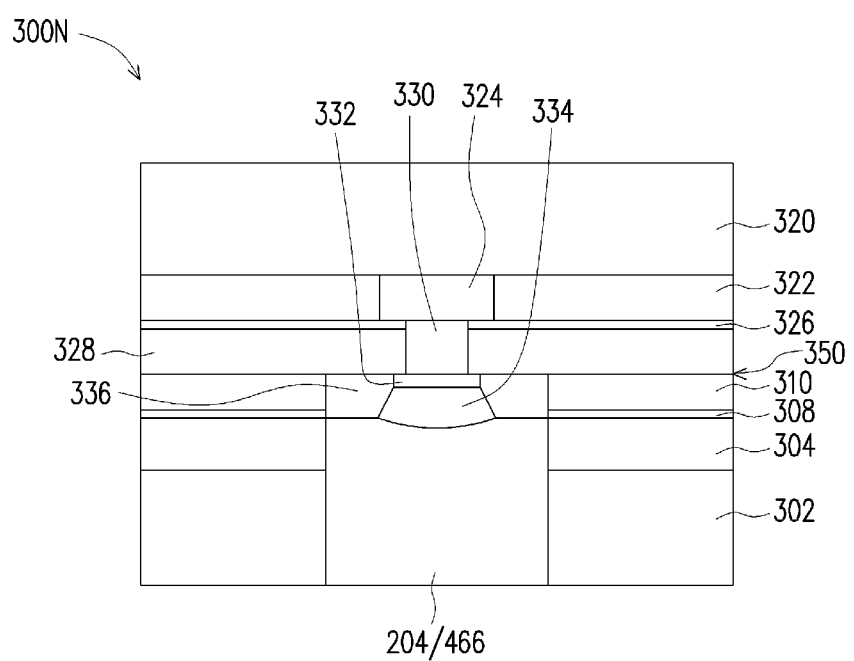
Figure 40:
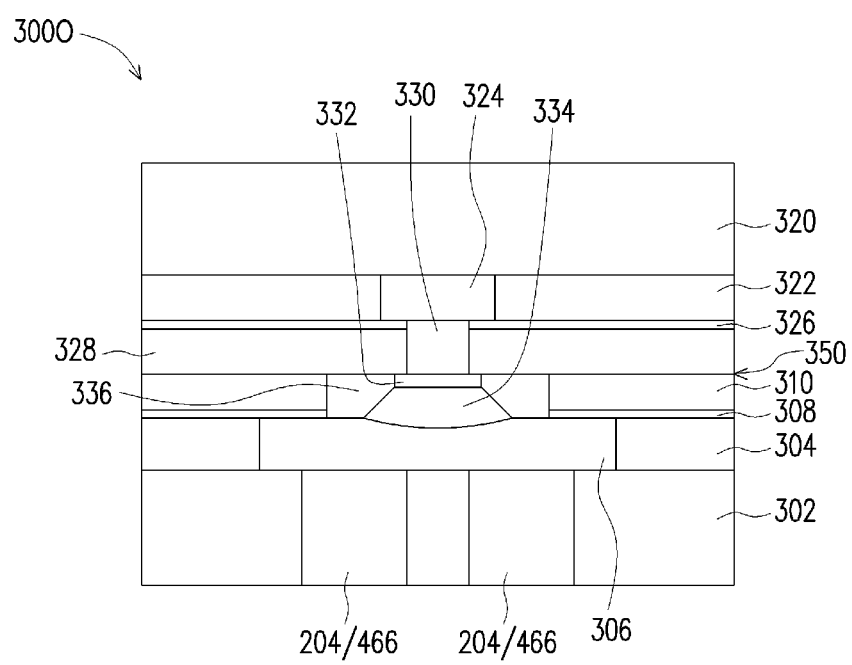

FIG. 4N illustrates another configuration 300N of the bonding joint 300 of FIG. 3. This embodiment is similar to the previous embodiment of FIG. 4L except that in this embodiment, the width of the void 336 is equal to the width of through via 204/through via 466 adjoining the solder material 334. Details regarding this embodiment that are similar to those for the previously described embodiment will not be repeated herein.

FIG. 4O illustrates another configuration 300O of the bonding joint 300 of FIG. 3. This embodiment is similar to the previous embodiment of FIG. 4J except that in this embodiment, the recessed pad 312 is omitted and solder material 334 is directly coupled to the metallization layer 306. Details regarding this embodiment that are similar to those for the previously described embodiment will not be repeated herein.

In each of the configurations of FIGS. 4A, 4B, 4C, 4E-4O the hybrid bonding includes pre-bonding insulating layers (e.g., 310, 328, 340, and/or 342) on the active sides of the dies by lightly pressing the integrated circuit dies and together. After the pre-bonding, the reflow process is performed to cause the reflow of the solder layer 334.

Figure 5:
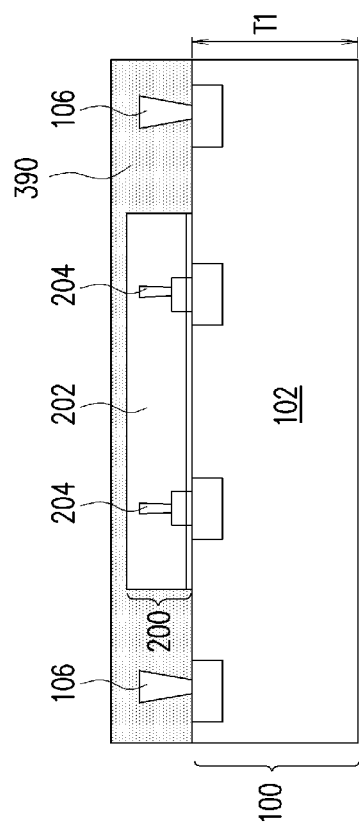

In FIG. 5, an encapsulant 390 is formed on the various components of FIG. 3. The encapsulant 390 may be a molding compound, an epoxy, an oxide, or the like, and may be applied by compression molding, transfer molding, lamination, flowable CVD, or the like. In some embodiments, the encapsulant may be an oxide layer such as, for example silicon oxide, tetraethylorthosilicate (TEOS) silicon oxide, or the like. In some embodiments, the encapsulant may be a nitride layer such as, for example silicon nitride, or the like. In some embodiments, the encapsulant may be a composite of organic and inorganic encapsulant or the like. The encapsulant 390 may be formed over the wafer including the integrated circuit die 100 such that the conductive pillars 106 and the integrated circuit dies 200 are buried or covered. The encapsulant 390 may then be cured. The semiconductor substrate 102 of the integrated circuit dies 100 may have a thickness T1 of about 775 μm.

Figure 6:
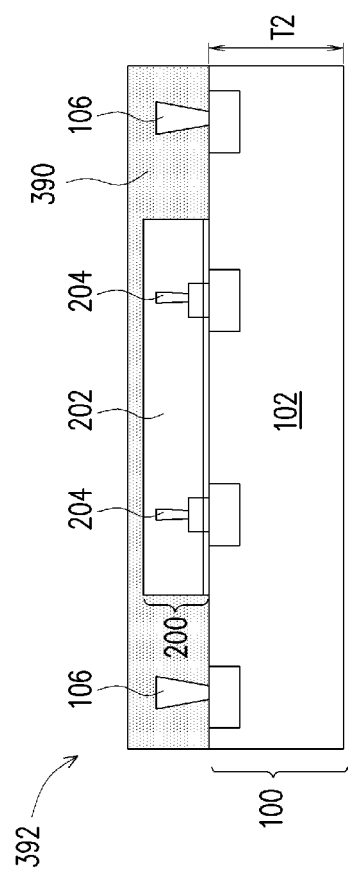

In FIG. 6, the semiconductor substrate 102 may be thinned to a thickness T2 which is less than the thickness T1. The thinning process may include a grinding process, such as a mechanical grinding, CMP, an etching process, or a combination thereof. In some embodiments, the thickness T2 is in a range from about 50 μm to about 150 μm.

After the thinning process, the package including the integrated circuit dies 100 and 200 may be singulated, such as by sawing or dicing to form multiple packages 392 with each package 392 including at least one integrated circuit die 100 and one integrated circuit die 200. In some embodiments, the singulating occurs in scribe line regions between package regions.

Figure 7:
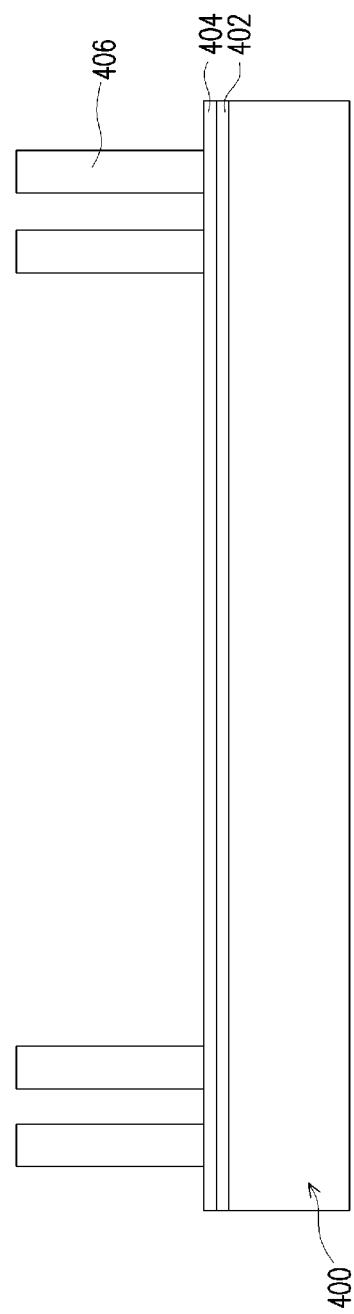

FIG. 7 illustrates a carrier substrate 400, a release layer 402 formed on the carrier substrate 400, and a dielectric layer 404 formed on the release layer 402. The carrier substrate 400 may be a glass carrier substrate, a ceramic carrier substrate, or the like. The carrier substrate 400 may be a wafer, such that multiple packages can be formed on the carrier substrate 400 simultaneously. The release layer 402 may be formed of a polymer-based material, which may be removed along with the carrier substrate 400 from the overlying structures that will be formed in subsequent steps. In some embodiments, the release layer 402 is an epoxy-based thermal-release material, which loses its adhesive property when heated, such as a light-to-heat-conversion (LTHC) release coating. In other embodiments, the release layer 402 may be an ultra-violet (UV) glue, which loses its adhesive property when exposed to UV lights. The release layer 402 may be dispensed as a liquid and cured, may be a laminate film laminated onto the carrier substrate 400, or may be the like. The top surface of the release layer 402 may be leveled and may have a high degree of coplanarity.

The dielectric layer 404 is formed on the release layer 402. The bottom surface of the dielectric layer 404 may be in contact with the top surface of the release layer 402. In some embodiments, the dielectric layer 404 is formed of a polymer, such as PBO, polyimide, BCB, or the like. In other embodiments, the dielectric layer 404 is formed of a nitride such as silicon nitride; an oxide such as silicon oxide, PSG, BSG, BPSG, or the like. The dielectric layer 404 may be formed by any acceptable deposition process, such as spin coating, chemical vapor deposition CVD, laminating, or the like, or a combination thereof. In some embodiments, one or more metallization patterns are formed on or in the dielectric layer 404 to form a redistribution structure. This redistribution structure may be referred to as a back-side redistribution structure.

Further in FIG. 7, electrical connectors 406 are formed. The electrical connectors 406 will extend through the subsequently formed encapsulant 408 (see FIG. 9) and may be referred to as through vias 406 hereinafter. As an example to form the through vias 406, a seed layer is formed over the underlying structure, e.g., the dielectric layer 404. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating, lamination or the like and may be exposed to light for patterning. The pattern of the photo resist corresponds to through vias 406. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the through vias 406.

Figure 8:
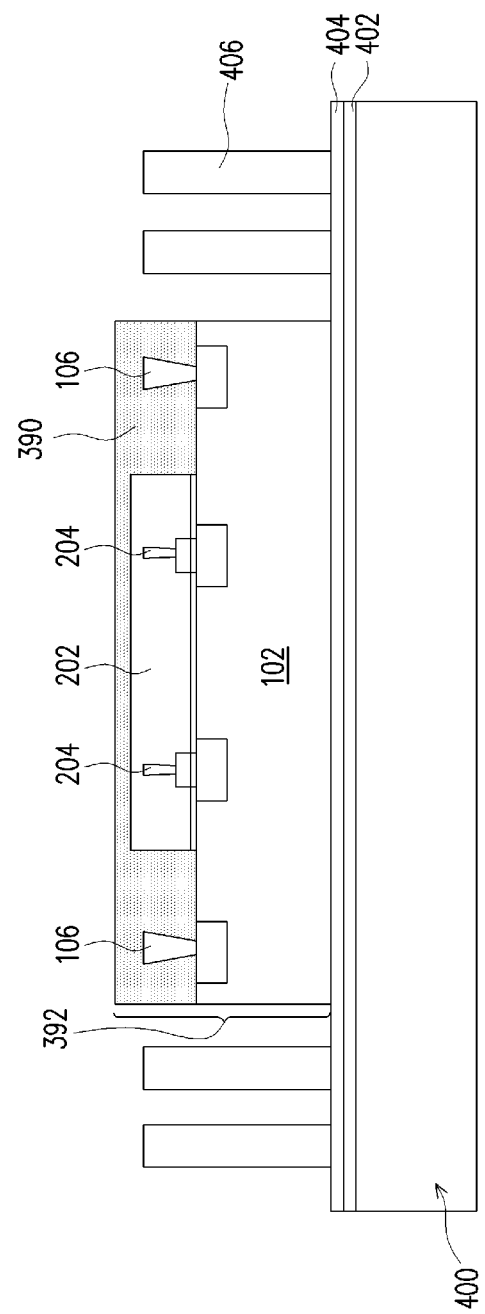

In FIG. 8, package 392 is attached to the release layer 402. Although one package 392 is illustrated as being attached, it should be appreciated that more or less packages 392 may be attached in each package region. Although not shown, the package 392 may be attached by an adhesive layer (not shown). The adhesive may be any suitable adhesive, epoxy, die attach film (DAF), or the like.

Figure 9:
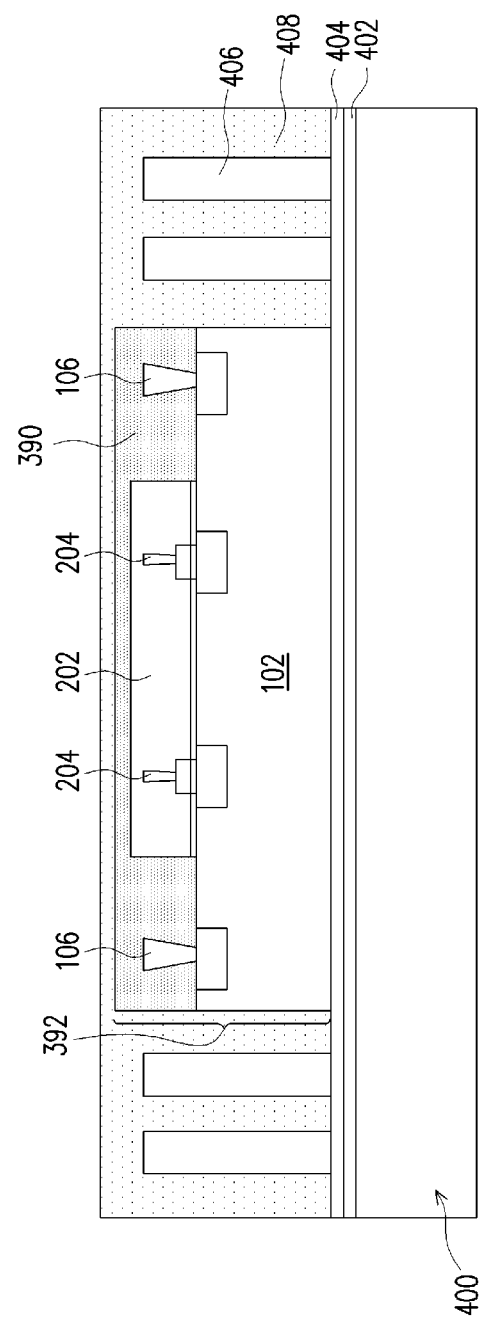

In FIG. 9, an encapsulant 408 is formed on the various components. The encapsulant 408 may be a molding compound, epoxy, or the like, and may be applied by compression molding, lamination, transfer molding, or the like. The encapsulant 408 may be formed over the carrier substrate 400 such that the electrical connectors 406 and the package 392 are buried or covered. The encapsulant 408 may then be cured. The encapsulants 408 and 390 may be made of the same material or different materials.

Figure 10:
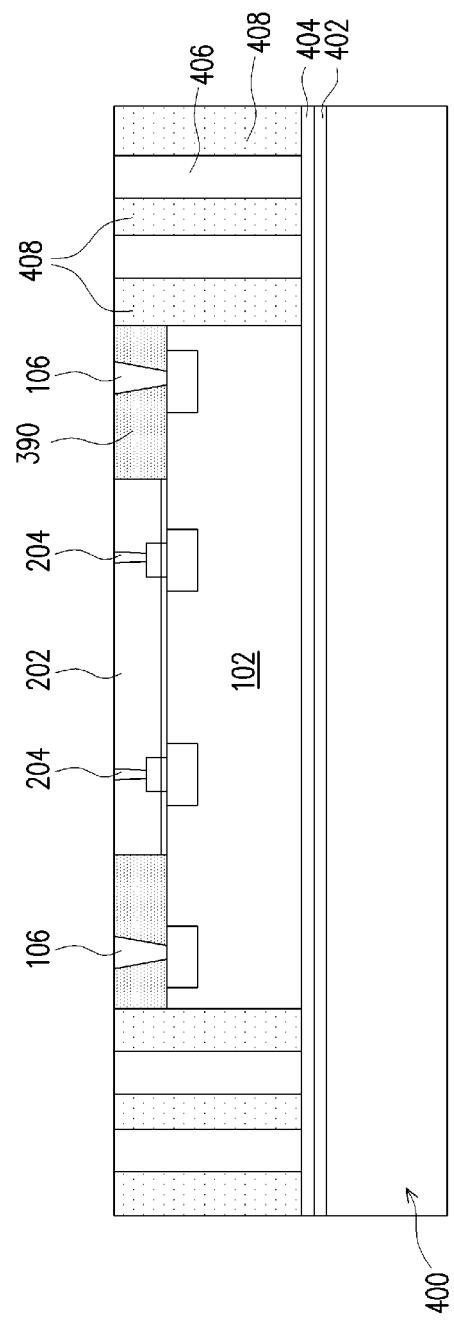

In FIG. 10, the encapsulant 408 can undergo a grinding process to expose the electrical connectors 406, conductive pillars 106, and through vias 204. Surfaces of the electrical connectors 406, conductive pillars 106, through vias 204, semiconductor substrate 202, and encapsulant 408 are level after the grinding process. In some embodiments, the grinding may be omitted, for example, if the electrical connectors 406, the conductive pillars 106, and the through vias 204 are already exposed. The electrical connectors 406 and the conductive pillars 106 may be referred to as through vias 406 and 106, respectively, hereinafter.

Figure 11:
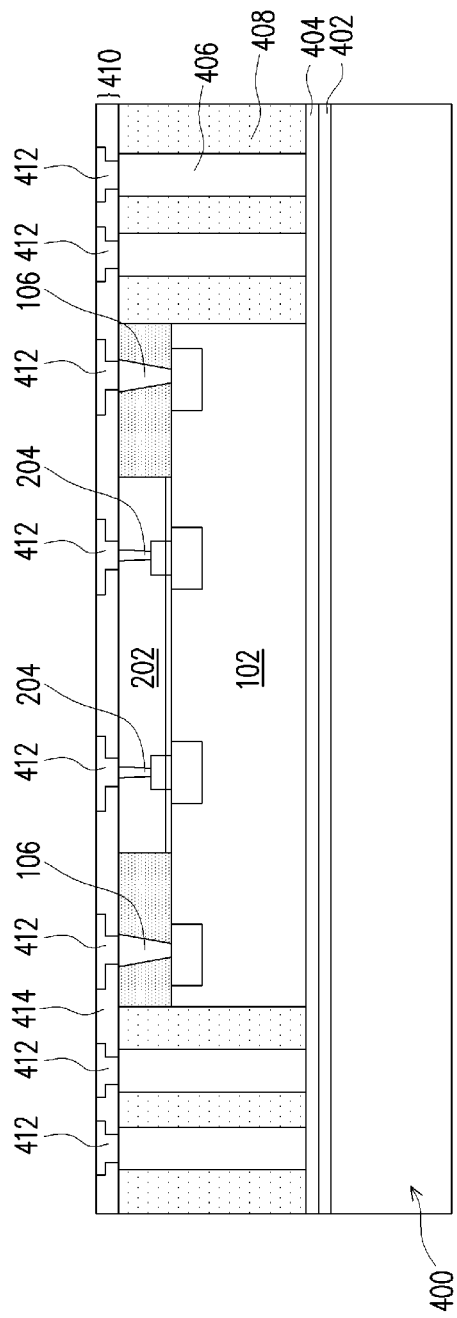

In FIG. 11, a front-side redistribution structure 410 is formed. The front-side redistribution structure 410 includes one or more dielectric layers 414 and one or more metallization patterns 412.

The formation of the front-side redistribution structure 410 may begin by depositing dielectric layer 414 on the encapsulant 408, through vias 406, through vias 204, and through vias 106. In some embodiments, the through vias 106 and 204 may have conductive pads formed on their tops to help the overlying metallization patterns 412 land on and be electrically coupled with the respective through vias 106 and 204 (see, e.g., FIG. 23 with pads 494). In some embodiments, the dielectric layer 414 is formed of a polymer, which may be a photo-sensitive material such as PBO, polyimide, BCB, or the like, that may be patterned using a lithography mask. In other embodiments, the dielectric layer 414 is formed of a nitride such as silicon nitride; an oxide such as silicon oxide, PSG, BSG, BPSG; or the like. The dielectric layer 414 may be formed by spin coating, lamination, CVD, the like, or a combination thereof.

Next, the dielectric layer 414 is then patterned. The patterning forms openings to expose portions of the through vias 406, 106, and 204. The patterning may be by an acceptable process, such as by exposing the dielectric layer 414 to light when the dielectric layer 414 is a photo-sensitive material or by ablation using, for example, a laser ablation or by etching using, for example, an anisotropic etch. If the dielectric layer 414 is a photo-sensitive material, the dielectric layer 414 can be developed after the exposure.

Next, metallization pattern 412 with vias is formed on the dielectric layer 414. As an example to form metallization pattern 412, a seed layer (not shown) is formed over the dielectric layer 414 and in openings through the dielectric layer 414. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 412. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 412 and vias. The vias are formed in openings through the dielectric layer 414 to, e.g., the through vias 406, 106, and 204.

This process may be repeated with more dielectric layers 414 and more metallization patterns and vias 412 to continue the formation of the redistribution structure 410. The materials and processes used to form these layers of the redistribution structure 410 may be similar to that described above and the description is not repeated herein. In some embodiments, the redistribution structure 410 is formed by a damascene process. In some embodiments, some of the layers of the redistribution structure 410 are formed by a dual damascene process and other layers are formed by the process described in the preceding paragraphs, for example, semi-additive process (SAP).

The front-side redistribution structure 410 is shown as an example. More or fewer dielectric layers and metallization patterns may be formed in the front-side redistribution structure 410. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 12:
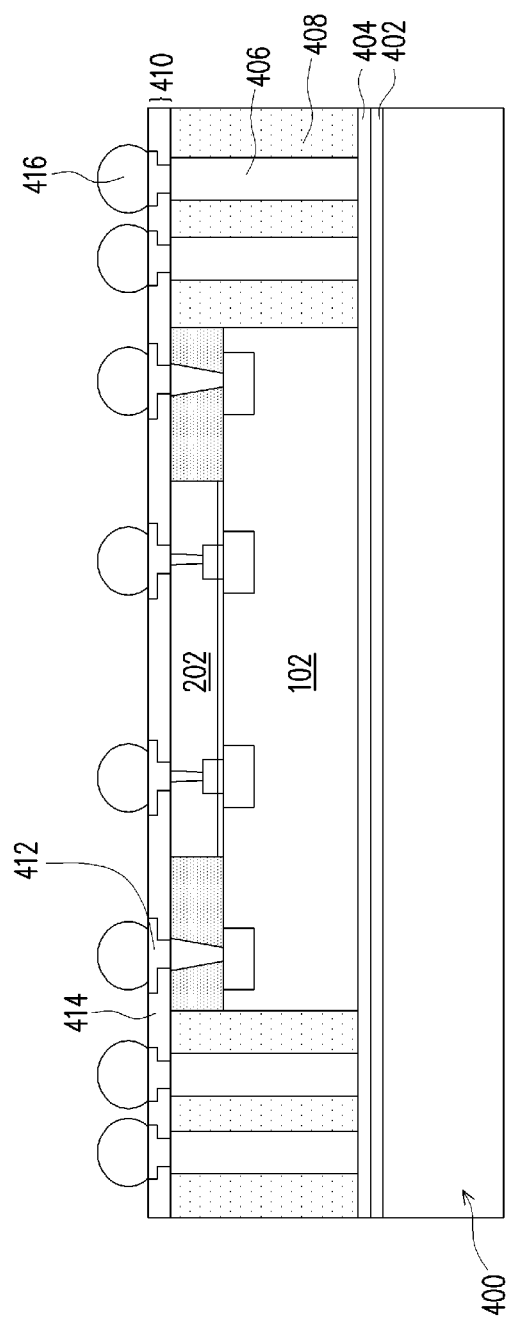

In FIG. 12, pads (not shown) are formed on an exterior side of the front-side redistribution structure 410 and conductive connectors 416 are formed on the pads. The pads are used to couple to conductive connectors 416 and may be referred to as under bump metallurgies (UBMs). The pads may be formed through openings in the uppermost dielectric layer 414 of the redistribution structure 410 to the uppermost metallization pattern 412. As an example to form the pads, a seed layer (not shown) is formed over the dielectric layer 414. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads. In the embodiment, where the pads are formed differently, more photo resist and patterning steps may be utilized.

Further in FIG. 12, conductive connectors 416 are formed on the pads/UBMs. The conductive connectors 416 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 416 may include a conductive material such as solder, copper, aluminum, gold, nickel, silver, palladium, tin, the like, or a combination thereof. In some embodiments, the conductive connectors 416 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 416 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 416. The metal cap layer may include nickel, tin, tin-lead, gold, silver, palladium, indium, nickel-palladium-gold, nickel-gold, the like, or a combination thereof and may be formed by a plating process.

Figure 13:
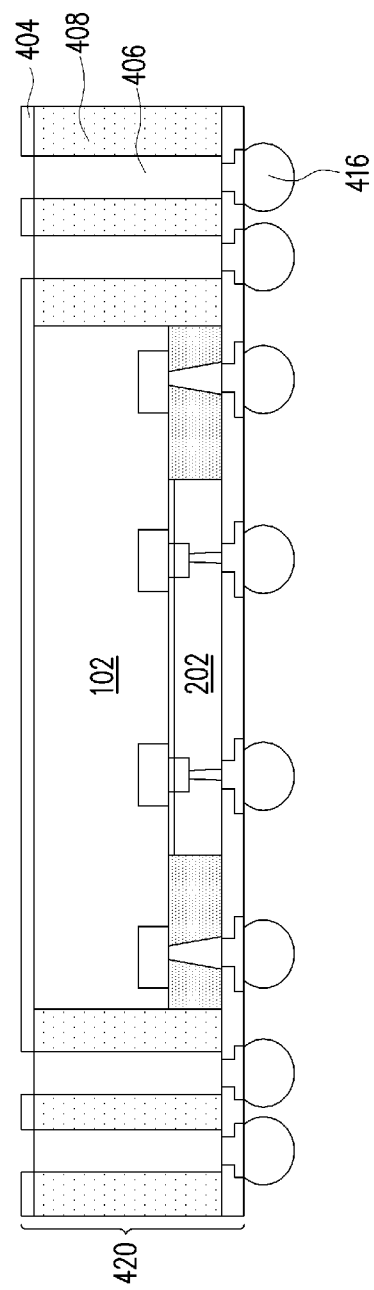

In FIG. 13, a carrier substrate de-bonding is performed to detach (de-bond) the carrier substrate 400 from the dielectric layer 404. The first package 420 are thereby formed in each of the package regions of the carrier. In accordance with some embodiments, the de-bonding includes projecting a light such as a laser light or an UV light on the release layer 402 so that the release layer 402 decomposes under the heat of the light and the carrier substrate 400 can be removed. Openings are formed through the dielectric layer 404 to expose portions of the metallization pattern through vias 406. The openings may be formed, for example, using laser drilling, etching, or the like.

Figure 14:
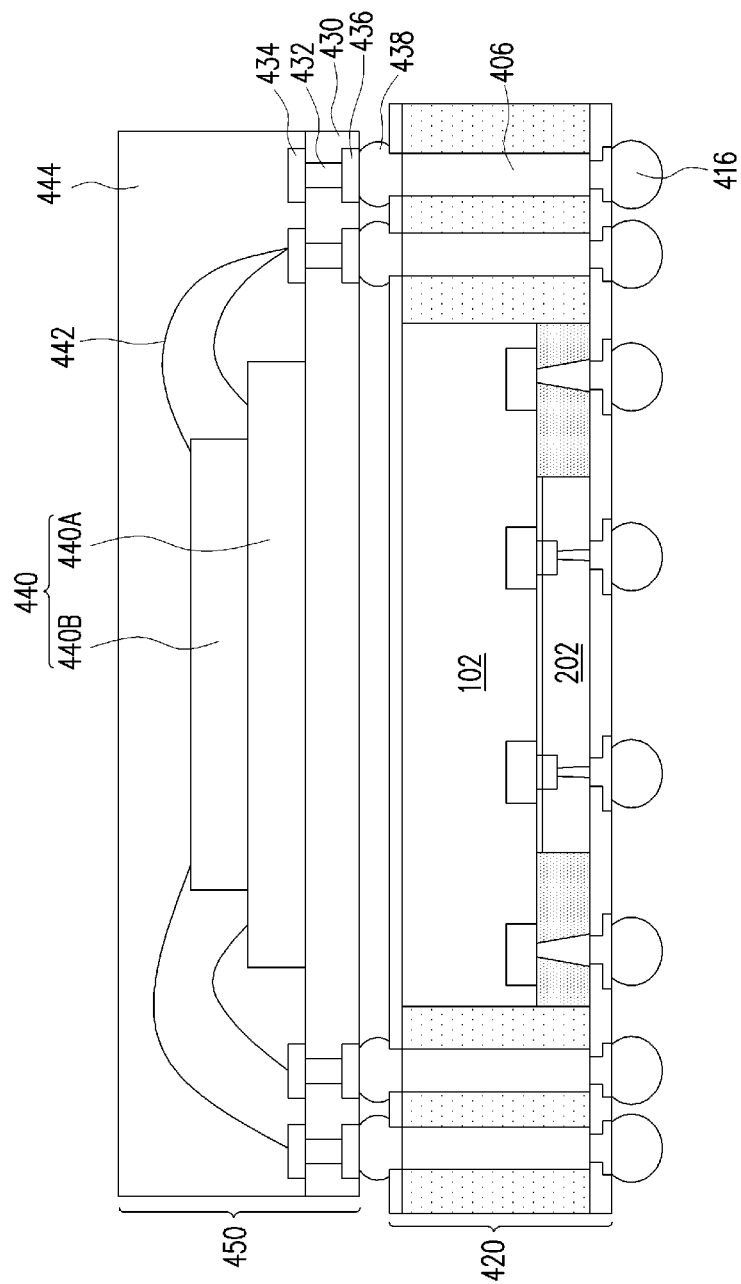

FIG. 14 illustrates a cross-sectional view of a package structure, in accordance with some embodiments. The package structure may be referred to a package-on-package (PoP) structure. In FIG. 14, a second package 450 is attached to the first package 420. The second package 450 includes a substrate 430 and one or more stacked dies 440 (440A and 440B) coupled to the substrate 430. Although a singular stack of dies 440 (440A and 440B) is illustrated, in other embodiments, a plurality of stacked dies 440 (each having one or more stacked dies) may be disposed side by side coupled to a same surface of the substrate 430. The substrate 430 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 430 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 430 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 430.

The substrate 430 may include active and passive devices (not shown). As one of ordinary skill in the art will recognize, a wide variety of devices such as transistors, capacitors, resistors, combinations of these, and the like may be used to generate the structural and functional requirements of the design for the second package 450. The devices may be formed using any suitable methods.

The substrate 430 may also include metallization layers (not shown) and through vias 432. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 430 is substantially free of active and passive devices.

The substrate 430 may have bond pads 434 on a first side the substrate 430 to couple to the stacked dies 440, and bond pads 436 on a second side of the substrate 430, the second side being opposite the first side of the substrate 430, to couple to the conductive connectors 438. In some embodiments, the bond pads 434 and 436 are formed by forming recesses (not shown) into dielectric layers (not shown) on the first and second sides of the substrate 430. The recesses may be formed to allow the bond pads 434 and 436 to be embedded into the dielectric layers. In other embodiments, the recesses are omitted as the bond pads 434 and 436 may be formed on the dielectric layer. In some embodiments, the bond pads 434 and 436 include a thin seed layer (not shown) made of copper, titanium, nickel, gold, palladium, the like, or a combination thereof. The conductive material of the bond pads 434 and 436 may be deposited over the thin seed layer. The conductive material may be formed by an electrochemical plating process, an electroless plating process, CVD, ALD, PVD, the like, or a combination thereof. In an embodiment, the conductive material of the bond pads 434 and 436 is copper, tungsten, aluminum, silver, gold, the like, or a combination thereof.

In an embodiment, the bond pads 434 and 436 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 434 and 436. Any suitable materials or layers of material that may be used for the bond pads 434 and 436 are fully intended to be included within the scope of the current application. In some embodiments, the through vias 432 extend through the substrate 430 and couple at least one bond pad 434 to at least one bond pad 436.

In the illustrated embodiment, the stacked dies 440 are coupled to the substrate 430 by wire bonds 442, although other connections may be used, such as conductive bumps. In an embodiment, the stacked dies 440 are stacked memory dies. For example, the stacked dies 440 may be memory dies such as low-power (LP) double data rate (DDR) memory modules, such as LPDDR1, LPDDR2, LPDDR3, LPDDR4, or the like memory modules.

The stacked dies 440 and the wire bonds 442 may be encapsulated by a molding material 444. The molding material 444 may be molded on the stacked dies 440 and the wire bonds 442, for example, using compression molding. In some embodiments, the molding material 444 is a molding compound, a polymer, an epoxy, silicon oxide filler material, the like, or a combination thereof. A curing step may be performed to cure the molding material 444, wherein the curing may be a thermal curing, a UV curing, the like, or a combination thereof.

In some embodiments, the stacked dies 440 and the wire bonds 442 are buried in the molding material 444, and after the curing of the molding material 444, a planarization step, such as a grinding, is performed to remove excess portions of the molding material 444 and provide a substantially planar surface for the second package 450.

After the second package 450 is formed, the second package 450 is mechanically and electrically bonded to the first package 420 by way of conductive connectors 438, the bond pads 436, and the through vias 406 (or backside redistribution structure if present). In some embodiments, the stacked dies 440 may be coupled to the package 392 through the wire bonds 442, the bond pads 434 and 436, through vias 432, the conductive connectors 438, through vias 406, and redistribution structure 410.

The conductive connectors 438 may be similar to the conductive connectors 416 described above and the description is not repeated herein, although the conductive connectors 438 and the conductive connectors 416 need not be the same. The conductive connectors 438 may be disposed on an opposing side of the substrate 430 as the stacked dies 440. In some embodiments, a solder resist (not separately labeled) may also be formed on the side of the substrate opposing the stacked dies 440. The conductive connectors 438 may be disposed in openings in the solder resist to be electrically and mechanically coupled to conductive features (e.g., the bond pads 436) in the substrate 430. The solder resist may be used to protect areas of the substrate 430 from external damage.

In some embodiments, before bonding the conductive connectors 438, the conductive connectors 438 are coated with a flux (not shown), such as a no-clean flux. The conductive connectors 438 may be dipped in the flux or the flux may be jetted onto the conductive connectors 438. In another embodiment, the flux may be applied to the surfaces of the through vias 406 (or backside redistribution structure if present).

In some embodiments, the conductive connectors 438 may have an optional epoxy flux (not shown) formed thereon before they are reflowed with at least some of the epoxy portion of the epoxy flux remaining after the second package 450 is attached to the first package 420.

An underfill (not shown) may be formed between the first package 420 and the second package 450 and surrounding the conductive connectors 438. The underfill may reduce stress and protect the joints resulting from the reflowing of the conductive connectors 438. The underfill may be formed by a capillary flow process after the second package 450 is attached or may be formed by a suitable deposition method before the second package 450 is attached. In embodiments where the epoxy flux is formed, it may act as the underfill.

The bonding between the second package 450 and the first package 420 may be a solder bonding. In an embodiment, the second package 450 is bonded to the first package 420 by a reflow process. During this reflow process, the conductive connectors 438 are in contact with the bond pads 436 and the through vias 406 (or backside redistribution structure if present) to physically and electrically couple the second package 450 to the first package 420. After the bonding process, an intermetallic compound (IMC, not shown) may form at the interface of the through vias 406 (or backside redistribution structure if present) and the conductive connectors 438 and also at the interface between the conductive connectors 438 and the bond pads 436 (not shown). In an embodiment, after the bonding process, a underfill materials may be applied to cover the bonding conductive connectors to provide an extra protection against adverse environment conditions, for example, moisture, particle, and chemical corrosion or the like.

A singulation process is performed by sawing along scribe line regions, e.g., between the package regions. The resulting, singulated first and second packages 420 and 450 are from one of the package regions. In some embodiments, the singulation process is performed after the second package 450 is attached to the first package 420. In other embodiments (not shown), the singulation process is performed before the second package 450 is attached to the first package 420, such as after the carrier substrate 400 is de-bonded.

Figure 15:
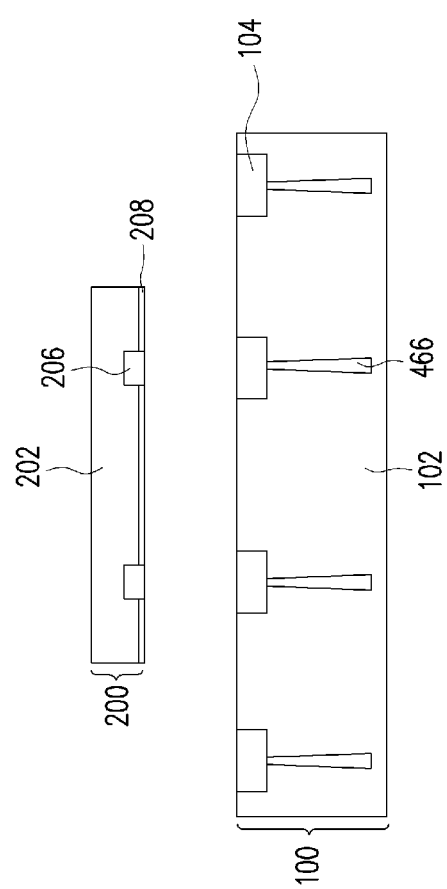
FIGS. 15 through 21 illustrate cross-sectional views of intermediate steps during a process for forming a package structure in accordance with some embodiments.

Further processing may be performed on the package structure of FIG. 15. For example, the package structure of FIG. 15 may be mounted to a package substrate using the conductive connectors 416.

FIGS. 15 through 21 illustrate cross-sectional views of another package structure in accordance with some embodiments. The embodiment in FIGS. 15 through 21 is similar to the embodiment illustrated in FIGS. 1 through 14 except that this embodiment includes through vias 466 in the integrated circuit die 100 and the integrated circuit die 200 does not include through vias. In addition, the integrated circuit dies 100 and 200 are reverse oriented in the package structure, e.g., integrated circuit die 100 is over integrated circuit die 200 when they are attached to the carrier substrate 400 (see FIG. 18). Details regarding this embodiment that are similar to those for the previously described embodiment will not be repeated herein.

In FIG. 15, the integrated circuit die 100 is illustrated including through vias 466. Details regarding this embodiment of the integrated circuit die 100 that are similar to those for the previously described integrated circuit die 100 embodiment will not be repeated herein.

In this embodiment, the through vias 466 extend from the pad 104 on the active side of integrated circuit die 100 into the semiconductor substrate 102 of the integrated circuit die 100. The formation of the through vias 466 may be similar to the through vias 204 of the integrated circuit die 200 in the previous embodiment and the description is not repeated herein.

Although two through vias 466 are illustrated in the integrated circuit die 100, it should be appreciated that there may be more or less through vias 466 in each integrated circuit die 100.

Figure 16:
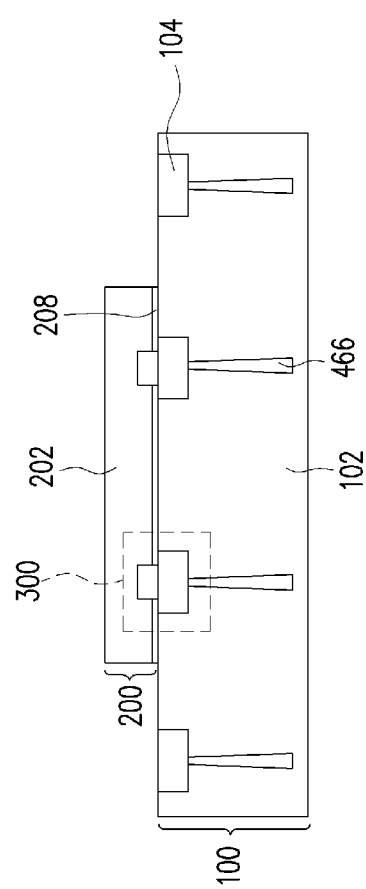

FIG. 16 illustrates further processing on the structure of FIG. 15. The processing between these two figures is similar to the processing illustrated and described above in reference to FIGS. 2 and 3 with FIG. 3 being an equivalent intermediate stage as FIG. 6 and the descriptions are not repeated herein.

In FIG. 16, the integrated circuit dies 100 and 200 are bonded together with bonding joints 300. The bonding joints 300 can be any of the bonding joint configurations 300A-300O in FIGS. 4A-4O.

Figure 17:
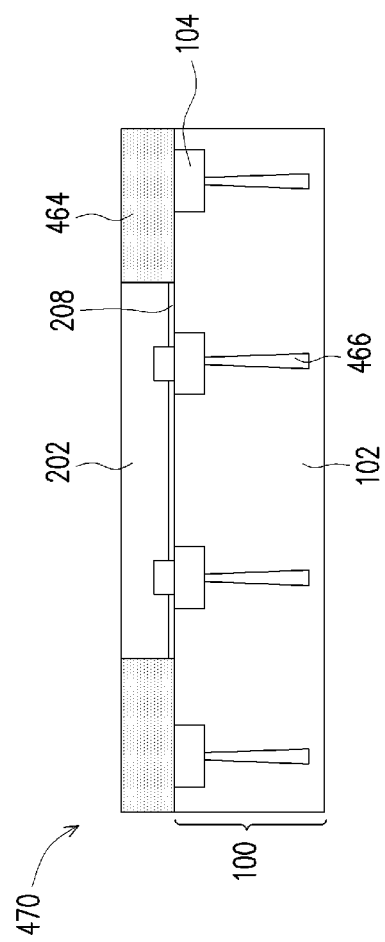

FIG. 17 illustrates further processing on the structure of FIG. 16. The processing between these two figures is similar to the processing illustrated and described above in reference to FIGS. 3 through 5 with FIG. 5 being an equivalent intermediate stage as FIG. 17 and the descriptions are not repeated herein. The bonded integrated circuit dies 100 and 200 are encapsulated with encapsulant 464 to form a package 470.

Figure 18:
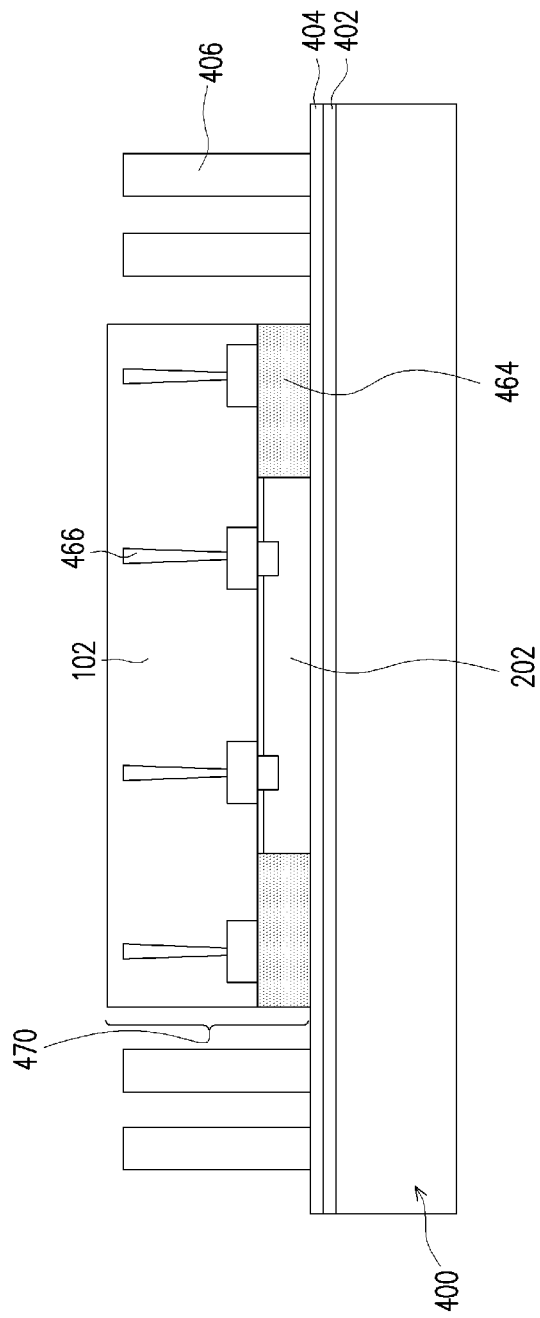

FIG. 18 illustrates the attaching of the package 470 on a carrier substrate 400 similar to that described above in FIGS. 7 and 8 and the descriptions are not repeated herein. In FIG. 18, the package 470 is attached to the carrier with the integrated circuit die 200 nearer to the carrier substrate than the integrated circuit die 100.

Figure 19:
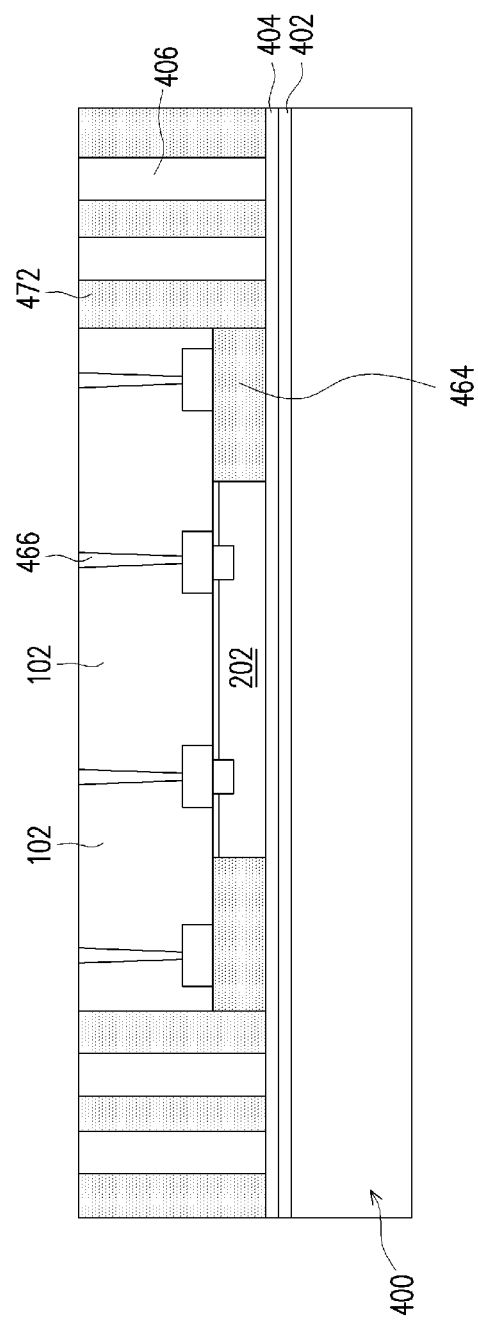

FIG. 19 illustrates further processing on the structure of FIG. 18. The processing between these two figures is similar to the processing illustrated and described above in reference to FIGS. 9 and 10 with FIG. 10 being an equivalent intermediate stage as FIG. 19 and the descriptions are not repeated herein. The package 470 is encapsulated with encapsulant 472 and the upper surface is planarized.

In FIG. 19, the encapsulant 472 can undergo a grinding process to expose the electrical connectors 406 and through vias 466. Surfaces of the electrical connectors 406, through vias 466, semiconductor substrate 102, and encapsulant 472 are level after the grinding process.

Figure 20:
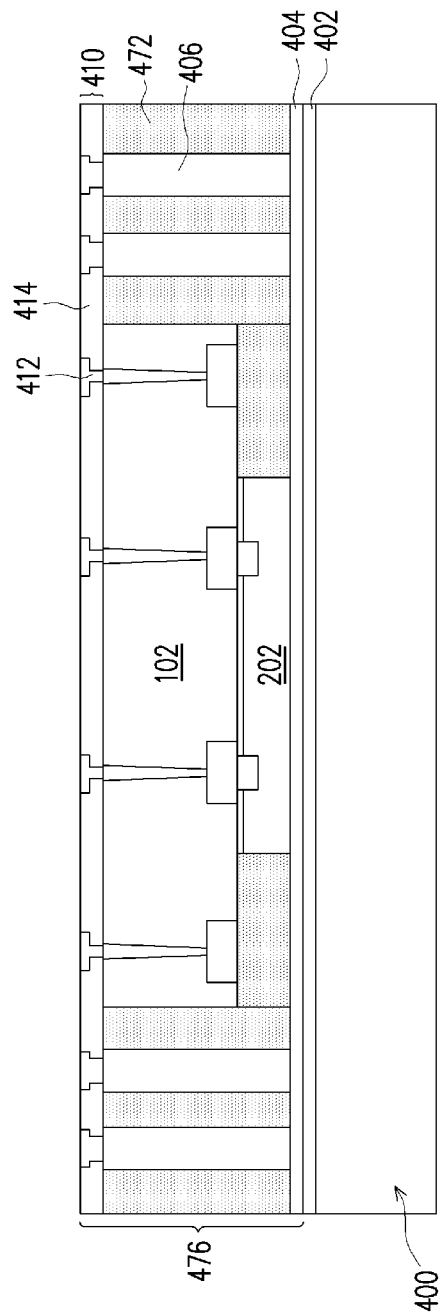

FIG. 20 illustrates further processing on the structure of FIG. 19. The processing between these two figures is similar to the processing illustrated and described above in reference to FIGS. 10 and 11 with FIG. 11 being an equivalent intermediate stage as FIG. 20 and the descriptions are not repeated herein. In FIG. 20, the redistribution structure 410 is formed to be over and electrically coupled to the through vias 406 and through vias 466.

Figure 21:
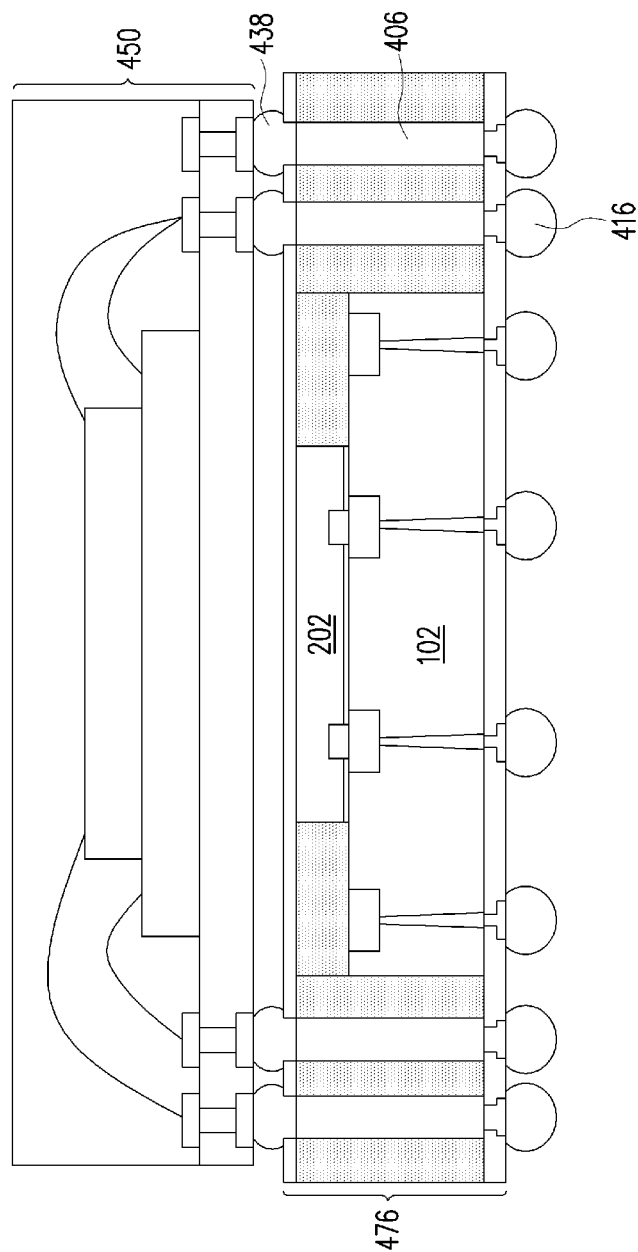
Figure 22:
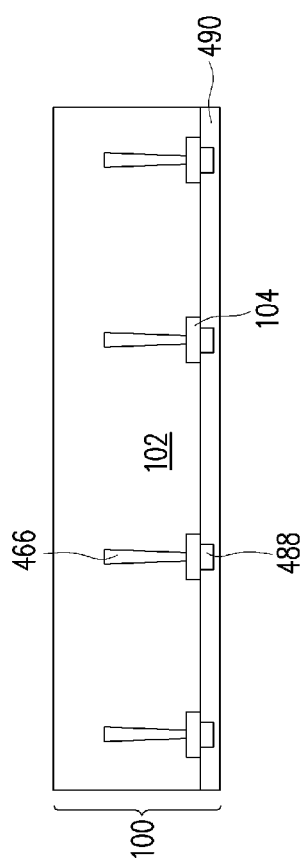
FIGS. 22 through 28 illustrate cross-sectional views of intermediate steps during a process for forming a package structure in accordance with some embodiments.

FIG. 21 illustrates further processing on the structure of FIG. 20. The processing between these two figures is similar to the processing illustrated and described above in reference to FIGS. 12 through 14 with FIG. 14 being an equivalent intermediate stage as FIG. 21 and the descriptions are not repeated herein. In FIG. 21, a second package 450 is bonded to package structure 476 of FIG. 20.

Further processing may be performed on the package structure of FIG. 21. For example, the package structure of FIG. 21 may be mounted to a package substrate using the conductive connectors 416.

FIGS. 22 through 28 illustrate cross-sectional views of another package structure in accordance with some embodiments. The embodiment in FIGS. 22 through 28 is similar to the embodiment illustrated in FIGS. 15 through 21 except that this embodiment has the integrated circuit dies 100 and 200 bonded face-to-back instead of face-to-face. In addition, the integrated circuit dies 100 includes die connectors 488 and an insulating layer 490 on the pads 104 on the active side of the integrated circuit die 100. These die connectors 488 and insulating layer 490 can protect the pads 104 during a subsequent planarization process. Details regarding this embodiment that are similar to those for the previously described embodiment will not be repeated herein.

The die connectors 488 may be formed of similar materials and by similar processes as the pads 104 described above and the description is not repeated herein. In this embodiment, the die connectors could be copper pillars and the pads 104 could be aluminum contact pads. The insulating layer 490 could be similar to the insulating layer 208 described above and the description is not repeated herein.

Figure 23:
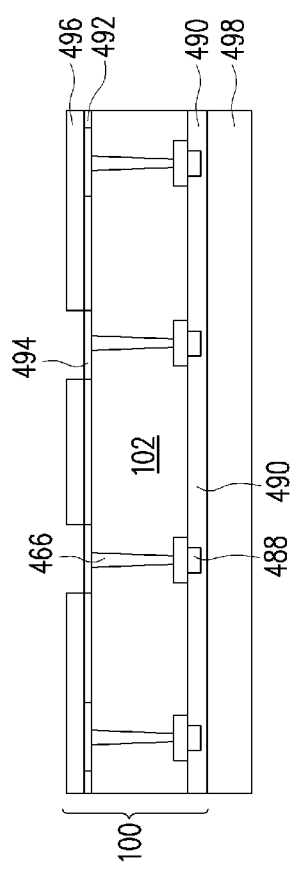

In FIG. 23, the active side of the integrated circuit die 100 is attached to a carrier substrate 498. The carrier substrate 498 is similar to the carrier substrate 400 described above and the description is not repeated herein. The backside of the integrated circuit die 100 is thinned to expose the through vias 466. The thinning can be similar to the thinning process described above in FIG. 6 and the description is not repeated herein. After the thinning process, insulating layers 492 and 496 and pads 494 are formed on the backside of the integrated circuit die 100. The insulating layers 492 and 496 and pads 494 will be utilized in the bonding of the integrated circuit die 100 to the integrated circuit die 200. The pads 494 are electrically coupled to the exposed through vias 466. The pads 494 can be formed of similar materials and processes as the pads 104 described above and the description is not repeated herein. The insulating layers 492 and 496 can be formed of similar materials and processes as insulating layer 208 described above and the description is not repeated herein.

Figure 24:
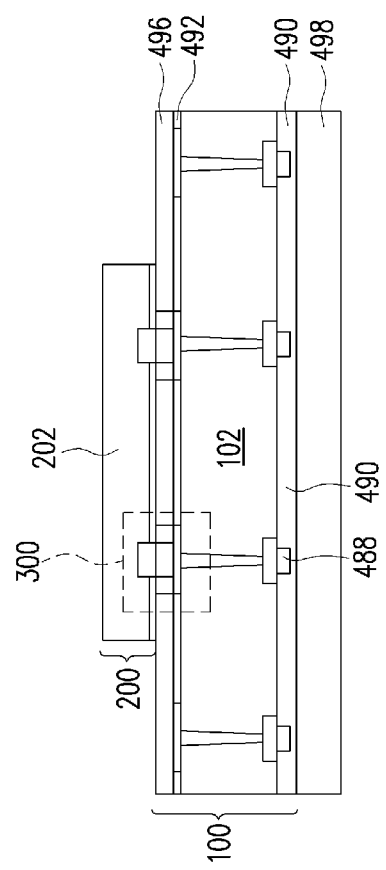

In FIG. 24, the integrated circuit die 100 is bonded to the integrated circuit die 200. The bonding was described in FIGS. 2 and 3 above and the descriptions are not repeated herein. In FIG. 24, the integrated circuit dies 100 and 200 are bonded together with bonding joints 300. The bonding joints 300 can be any of the bonding joint configurations 300A-300O in FIGS. 4A-4O.

Figure 25:
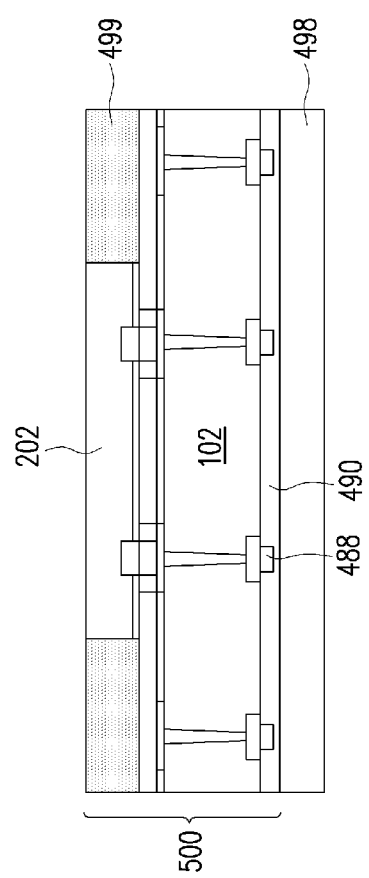

FIG. 25 illustrates further processing on the structure of FIG. 24. The processing between these two figures is similar to the processing illustrated and described above in reference to FIGS. 3 through 5 with FIG. 5 being an equivalent intermediate stage as FIG. 25 and the descriptions are not repeated herein. The bonded integrated circuit dies 100 and 200 are encapsulated with encapsulant 499 to form a package 500.

Figure 26:
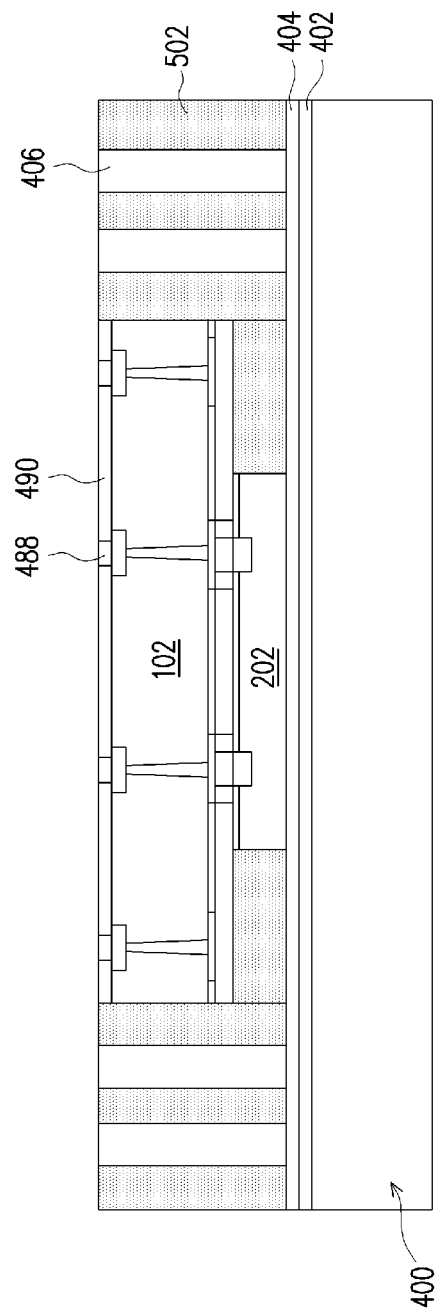

FIG. 26 illustrates the attaching of the package 500 on a carrier substrate 400 similar to that described above in FIGS. 7 and 8 and the descriptions are not repeated herein. In FIG. 26, the package 500 is attached to the carrier with the integrated circuit die 200 nearer to the carrier substrate than the integrated circuit die 100.

FIG. 26 illustrates further processing on the structure of FIG. 25. The processing between these two figures is similar to the processing illustrated and described above in reference to FIGS. 9 and 10 with FIG. 10 being an equivalent intermediate stage as FIG. 26 and the descriptions are not repeated herein. The package 500 is encapsulated with encapsulant 502 and the upper surface is planarized.

In FIG. 26, the encapsulant 502 can undergo a grinding process to expose the electrical connectors 406 and die connectors 488. Surfaces of the electrical connectors 406, die connectors 488, insulating layer 490, and encapsulant 502 are level after the grinding process.

Figure 27:
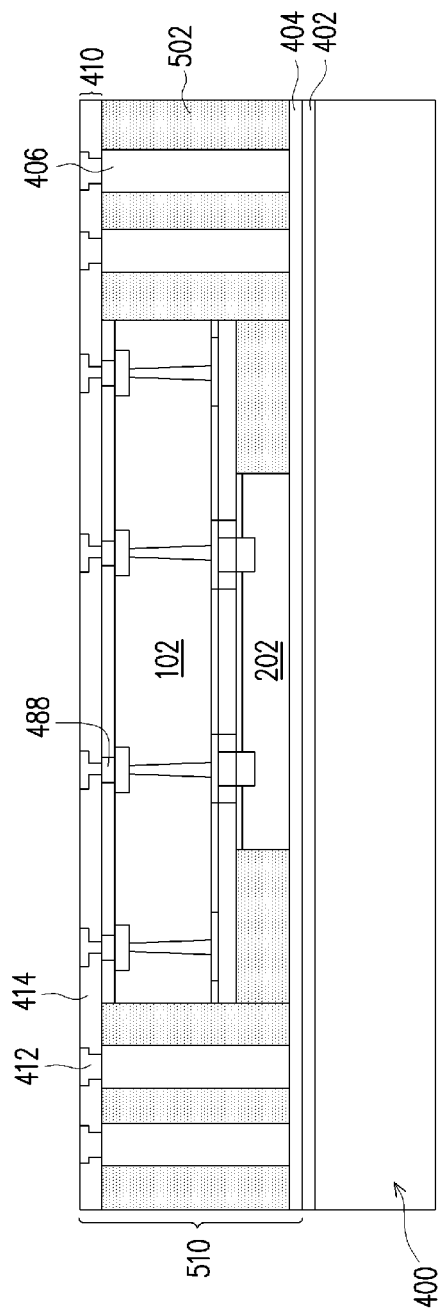

FIG. 27 illustrates further processing on the structure of FIG. 26. The processing between these two figures is similar to the processing illustrated and described above in reference to FIGS. 10 and 11 with FIG. 11 being an equivalent intermediate stage as FIG. 27 and the descriptions are not repeated herein. In FIG. 27, the redistribution structure 410 is formed to be over and electrically coupled to the through vias 406 and die connectors 488.

Figure 28:
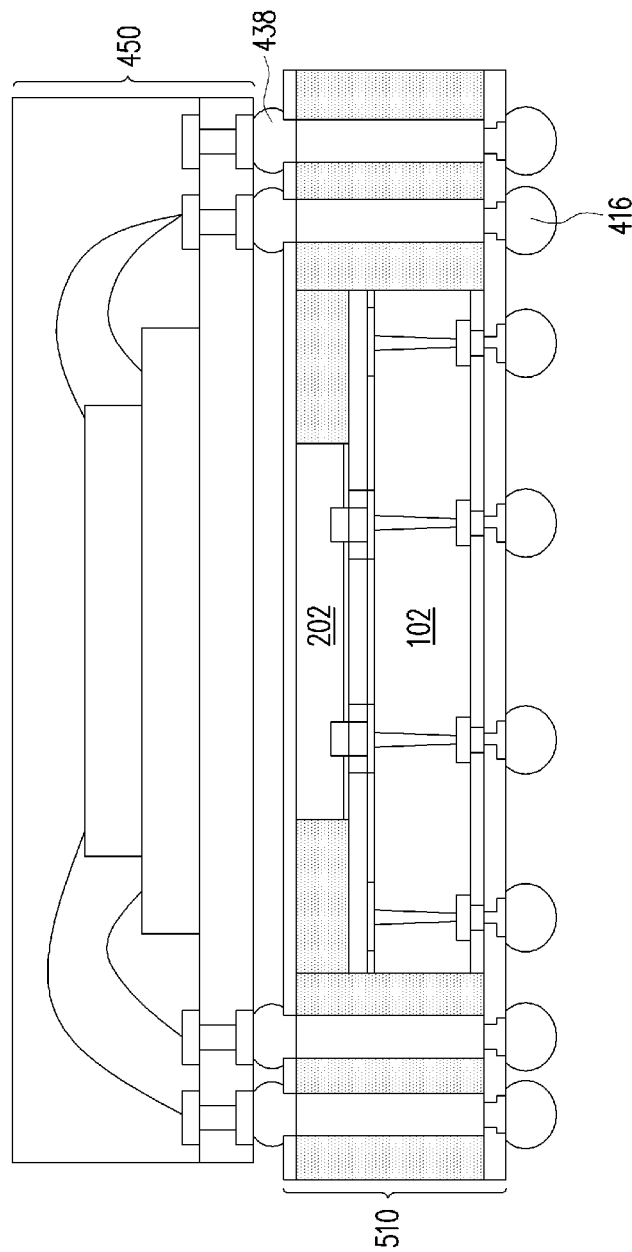

FIG. 28 illustrates further processing on the structure of FIG. 27. The processing between these two figures is similar to the processing illustrated and described above in reference to FIGS. 12 through 14 with FIG. 14 being an equivalent intermediate stage as FIG. 28 and the descriptions are not repeated herein. In FIG. 28, a second package 450 is bonded to package structure 500 of FIG. 27.

Further processing may be performed on the package structure of FIG. 28. For example, the package structure of FIG. 28 may be mounted to a package substrate using the conductive connectors 416.

Figure 32:
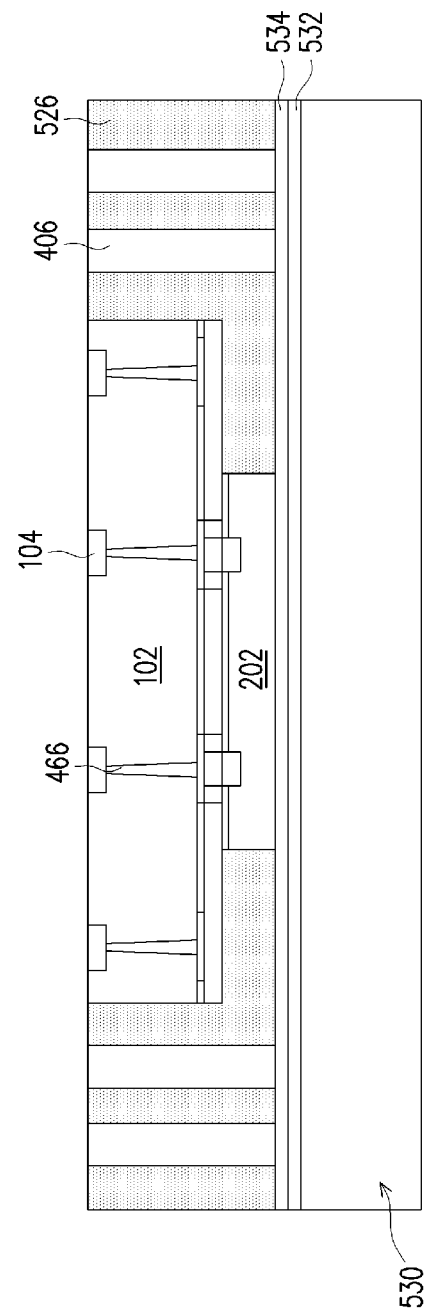
Figure 33:
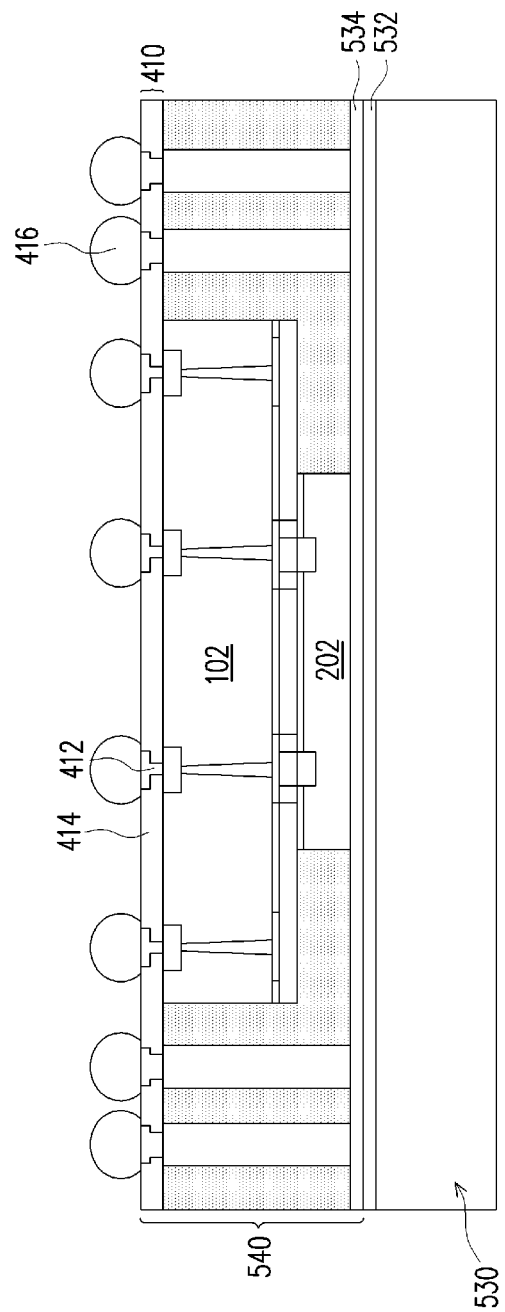
Figure 34:
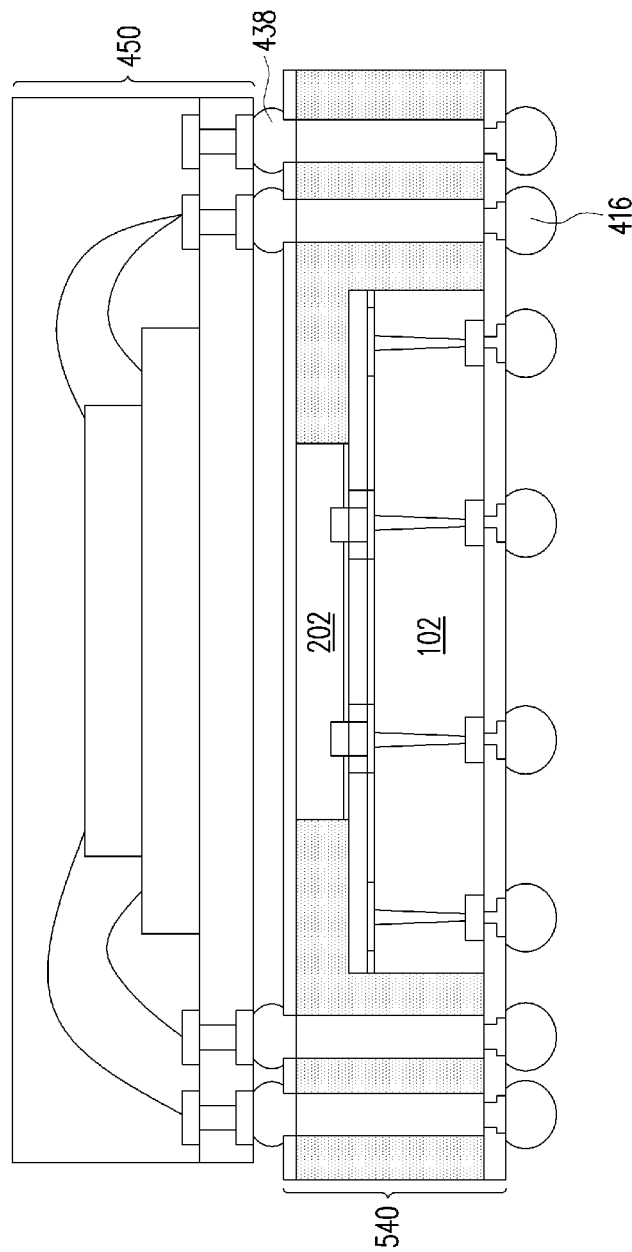

FIGS. 29 through 34 illustrate cross-sectional views of another package structure in accordance with some embodiments. The embodiment in FIGS. 39 through 34 is similar to the embodiment illustrated in FIGS. 22 through 28 except that this embodiment, the integrated circuit die 100 does not include die connectors 488 and insulating layer 490 on the pads 104 on the active side of the integrated circuit die 100. This removal of the die connectors 488 and insulating layer 490 requires an extra carrier substrate bonding/debonding to protect the pads 104. Details regarding this embodiment that are similar to those for the previously described embodiment will not be repeated herein.

Figure 29:
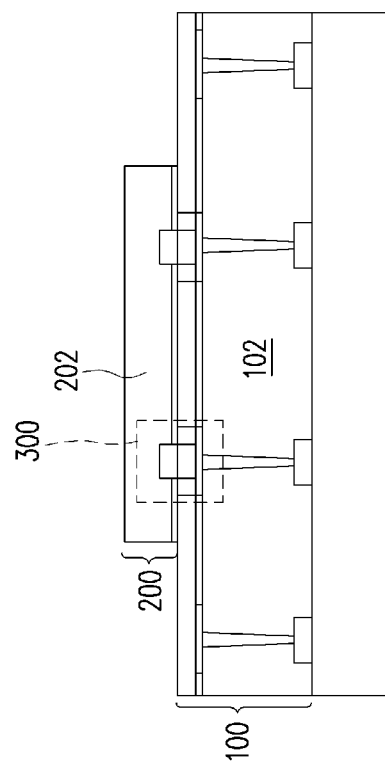
FIGS. 29 through 34 illustrate cross-sectional views of intermediate steps during a process for forming a package structure in accordance with some embodiments.

FIG. 29 illustrates the integrated circuit die 100 bonded to the integrate circuit die 200 as described above in FIG. 24 and the description is not repeated herein. The bonding was described in FIGS. 2 and 3 above and the descriptions are not repeated herein. In FIG. 29, the integrated circuit dies 100 and 200 are bonded together with bonding joints 300. The bonding joints 300 can be any of the bonding joint configurations 300A-300O in FIGS. 4A-4O.

Figure 30:
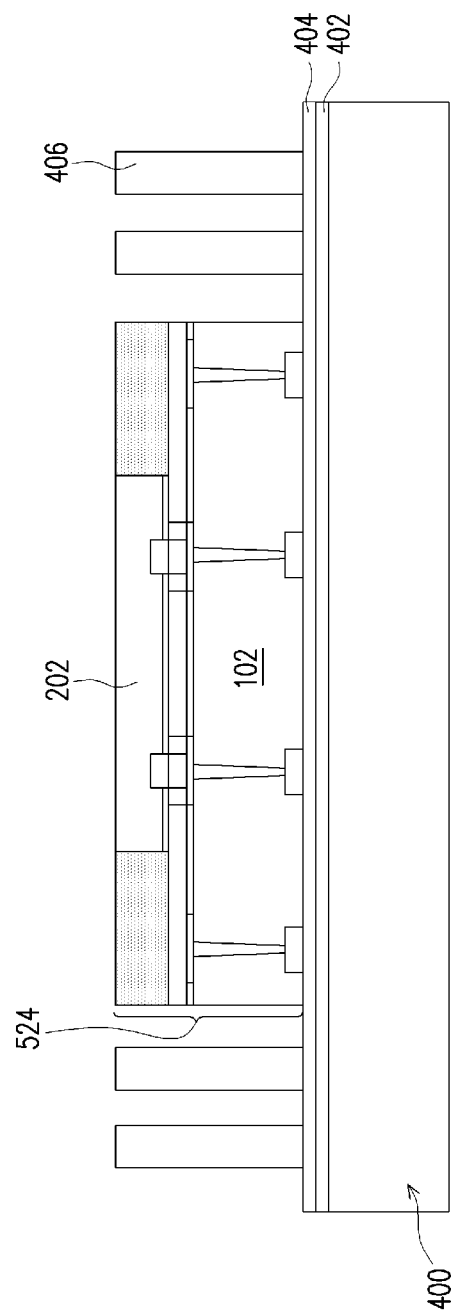

FIG. 30 illustrates further processing on the structure of FIG. 29. The processing between these two figures is similar to the processing illustrated and described above in reference to FIGS. 3 through 8 with FIG. 8 being an equivalent intermediate stage as FIG. 30 and the descriptions are not repeated herein. The bonded integrated circuit dies 100 and 200 are encapsulated with encapsulant 522 to form a package 524.

FIG. 30 further illustrates the attaching of the package 524 on a carrier substrate 400 similar to that described above in FIGS. 7 and 8 and the descriptions are not repeated herein. In FIG. 30, the package 524 is attached to the carrier with the integrated circuit die 100 nearer to the carrier substrate 400 than the integrated circuit die 200.

Figure 31:
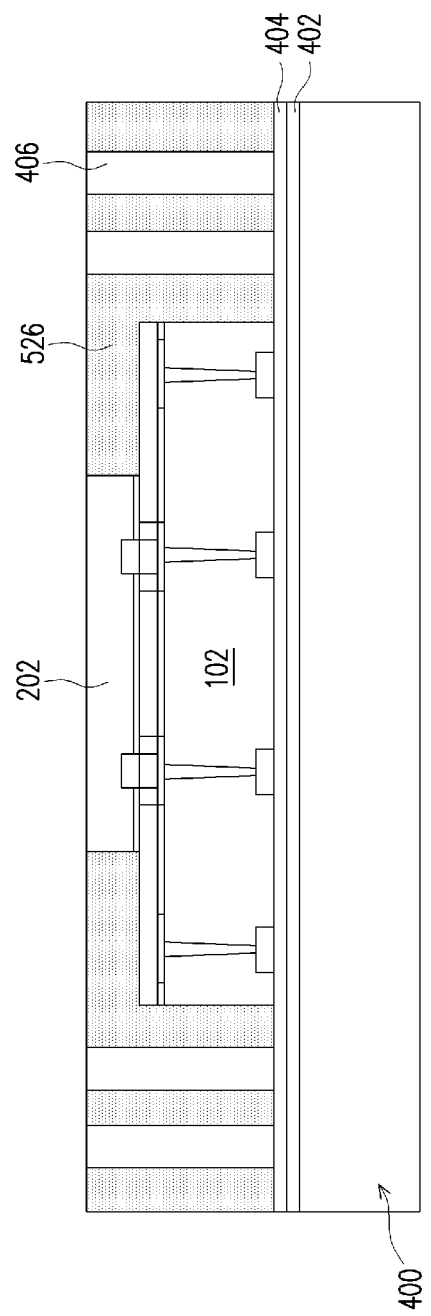

FIG. 31 illustrates further processing on the structure of FIG. 30. The processing between these two figures is similar to the processing illustrated and described above in reference to FIGS. 9 and 10 with FIG. 10 being an equivalent intermediate stage as FIG. 31 and the descriptions are not repeated herein. The package 524 is encapsulated with encapsulant 526 and the upper surface is planarized.

In FIG. 31, the encapsulant 526 can undergo a grinding process to expose the electrical connectors 406. Surfaces of the electrical connectors 406 and encapsulant 526 are level after the grinding process.

FIG. 32 illustrates further processing on the structure of FIG. 31. In FIG. 32, the carrier substrate 400 is debonded and the structure is flipped over and bonded to another carrier substrate 530. The debonding process was described above and the description is not repeated herein. In FIG. 32, the package 524 is attached to the carrier with the integrated circuit die 200 nearer to the carrier substrate 530 than the integrated circuit die 100. In FIG. 32, the exposed surface of the encapsulant 526, the electrical connectors 406 and the pads 104, and semiconductor substrate 102, are level without the grinding process.

FIG. 33 illustrates further processing on the structure of FIG. 32. The processing between these two figures is similar to the processing illustrated and described above in reference to FIGS. 10 and 11 with FIG. 11 being an equivalent intermediate stage as FIG. 33 and the descriptions are not repeated herein. In FIG. 33, the redistribution structure 410 and conductive connectors 416 are formed to be over and electrically coupled to the through vias 406 and pads 104.

FIG. 34 illustrates further processing on the structure of FIG. 33. The processing between these two figures is similar to the processing illustrated and described above in reference to FIGS. 12 through 14 with FIG. 14 being an equivalent intermediate stage as FIG. 34 and the descriptions are not repeated herein. In FIG. 34, a second package 450 is bonded to package structure 540 of FIG. 33.

Further processing may be performed on the package structure of FIG. 34. For example, the package structure of FIG. 34 may be mounted to a package substrate using the conductive connectors 416.

FIGS. 35 through 38 illustrate cross-sectional views of another package structure in accordance with some embodiments. The embodiment in FIGS. 35 through 38 is similar to the embodiment illustrated in FIGS. 1 through 14 except that in this embodiment, there is a gap between the dielectric layers of the integrated circuit dies 100 and 200 after they are bonded. Details regarding this embodiment that are similar to those for the previously described embodiment will not be repeated herein.

Figure 35:
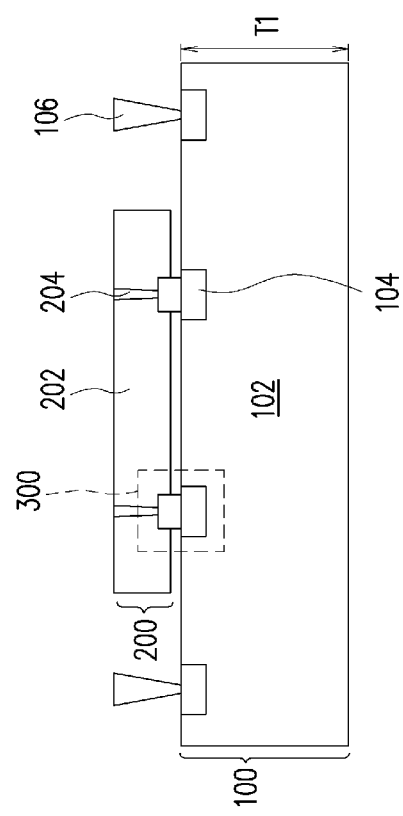
FIGS. 35 through 38 illustrate cross-sectional views of intermediate steps during a process for forming a package structure in accordance with some embodiments.

FIG. 35 illustrates the integrated circuit die 100 bonded to the integrate circuit die 200 as described in FIGS. 2 and 3 above and the descriptions are not repeated herein. In FIG. 35, the integrated circuit dies 100 and 200 are bonded together with bonding joints 300. The bonding joints 300 in this embodiment are the bonding joint configuration 300D in FIG. 4D. This embodiment includes the standoff gap between the dielectric layers of the integrated circuit dies 100 and 200.

Figure 36:
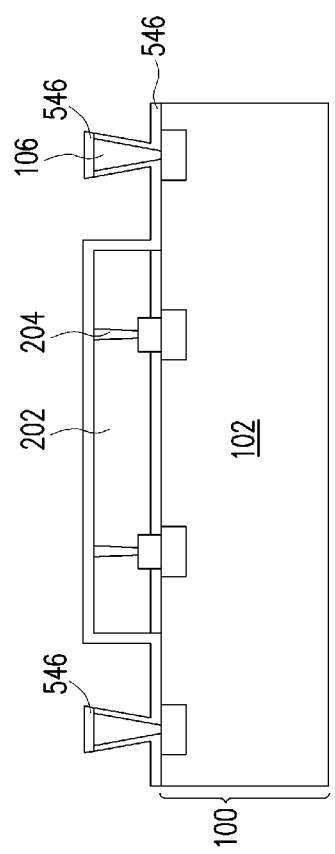

FIG. 36 illustrates further processing on the structure of FIG. 35. In FIG. 36, a sealing layer 546 is formed over the various components to seal the bonding interface between the integrated circuit dies 100 and 200. The sealing of the bonding interface can help the reliability of this embodiment as compared to not sealing the bonding interface in this configuration. The sealing layer 546 can be formed of similar materials and processes as the insulating layer 208 described above and the description is not repeated herein. In accordance of a embodiment, the sealing layer can be formed of polymer materials, for example, a Parylene, a polyimide, a BCB, and a PBO or the like. The forming methods may be by spraying, jetting, coating or the like.

Figure 37:
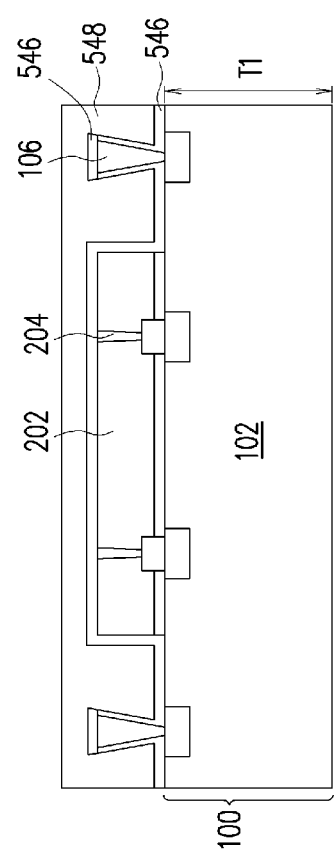

FIG. 37 illustrates further processing on the structure of FIG. 36. The processing between these two figures is similar to the processing illustrated and described above in reference to FIG. 5 with FIG. 5 being an equivalent intermediate stage as FIG. 37 and the descriptions are not repeated herein. The bonded integrated circuit dies 100 and 200 are encapsulated with encapsulant 548 to form a package.

Figure 38:
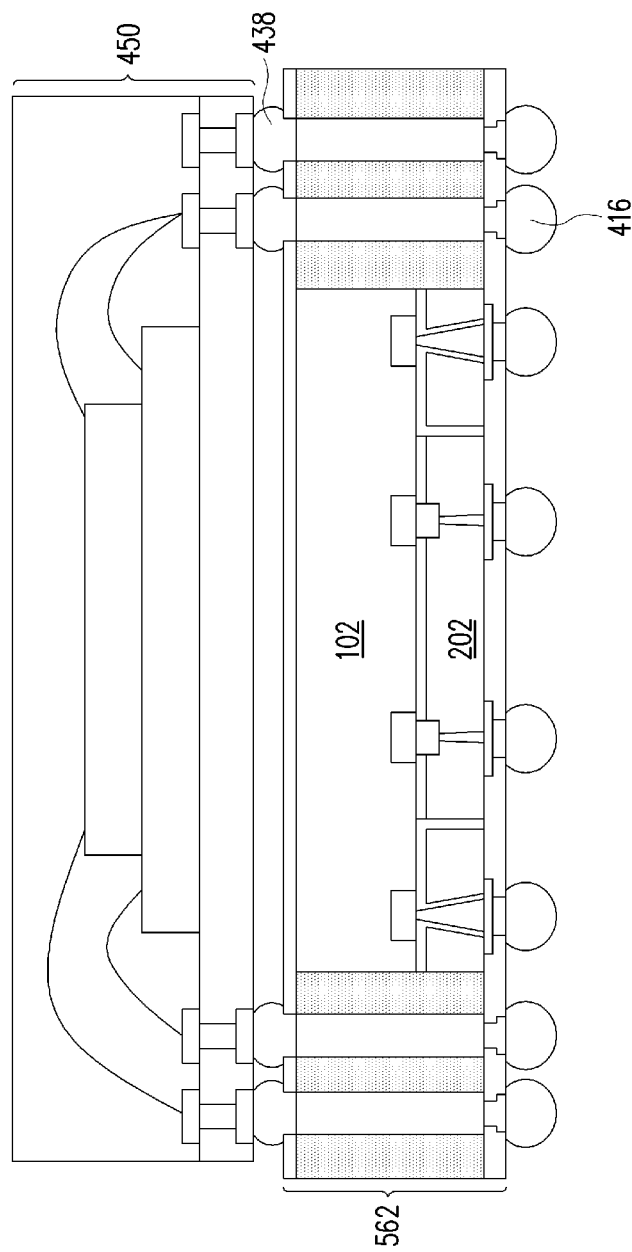

FIG. 38 illustrates further processing on the structure of FIG. 37. The processing between these two figures is similar to the processing illustrated and described above in reference to FIGS. 5 through 14 with FIG. 14 being an equivalent intermediate stage as FIG. 38 and the descriptions are not repeated herein. In FIG. 38, a second package 450 is bonded to package structure 562 that includes the bonded integrated circuit dies of FIG. 37.

Further processing may be performed on the package structure of FIG. 38. For example, the package structure of FIG. 38 may be mounted to a package substrate using the conductive connectors 416.

By forming a PoP structure including dies bonded together with a hybrid bonding technique utilizing solder instead of the typical copper-to-copper bonding of hybrid bonding. The bonding temperature of the hybrid bonding can be lowered significantly. In addition, the bond pads of the structures can be recessed to reduce the height of the package structure. The dies can be bonded together face-to-face (F2F) or face-to-back (F2B). For example, in a F2F bonding configuration the active surfaces (faces) of the dies are bonded together, whereas in a F2B bonding configuration, an active surface of one die is bonded to a back surface of another die.

In an embodiment, a package includes a first package structure including a first die having a first active side and a first back-side, the first active side including a first bond pad and a first insulating layer a second die bonded to the first die, the second die having a second active side and a second back-side, the second active side including a second bond pad and a second insulating layer, the second active side of the second die facing the first active side of the first die, the second insulating layer being bonded to the first insulating layer through dielectric-to-dielectric bonds, and a conductive bonding material bonded to the first bond pad and the second bond pad, the conductive bonding material having a reflow temperature lower than reflow temperatures of the first and second bond pads.

Embodiments may include one or more of the following features. The package where the first insulating layer is bonded to the second insulating layer with respective bonds including O—H bonds. The package where the first bond pad is recessed into the first insulating layer. The package where the first insulating layer and the second insulating layer are both made of a polymer. The package where the first insulating layer and the second insulating layer are both made of silicon nitride, silicon oxide, phosphosilicate glass (PSG), borosilicate glass (BSG), boron-doped phosphosilicate glass (BPSG), or a combination thereof. The package where there is void surrounding the conductive bonding material and between the first and second bond pads. The package where the first package structure further includes a conductive pad on the first active side of the first die, a first through via electrically coupled to the conductive pad, a first encapsulant on the first die and laterally encapsulating the second die and the first through via, the first through via extending through the first encapsulant; and a first redistribution structure over the second die, the first through via, and the first encapsulant, the first redistribution structure being electrically coupled to the first through via. The package where the first package structure further includes a second through via adjacent the first die, and a second encapsulant encapsulating the first die, the first encapsulant, and the second through via, the second through via extending through the second encapsulant, the first redistribution structure being electrically coupled to the second through via. The package further including a second package structure bonded to the second through via by a first conductive connector.

In an embodiment, a method including forming a first package including bonding a first side of a first die to a second side of a second die with a conductive bonding material and a first and second insulating layers, the first side including a first bond pad and the first insulating layer, the second side including a second bond pad and the second insulating layer, the second side of the second die facing the first side of the first die, the second insulating layer being bonded to the first insulating layer through dielectric-to-dielectric bonds, the conductive bonding material bonded to the first bond pad and the second bond pad, the conductive bonding material having a reflow temperature lower than reflow temperatures of the first and second bond pads.

Embodiments may include one or more of the following features. The method where forming the first package further includes forming a first conductive pillar on and electrically coupled to a third bond pad on the first side of the first die, and encapsulating the first die, the second die, and the first conductive pillar with a first encapsulant. The method where forming the first package further includes forming an electrical connector over a carrier substrate attaching the bonded first and second dies to the carrier substrate adjacent the electrical connector, the first die being adjacent the carrier substrate, encapsulating the bonded first and second dies, the first encapsulant, and the electrical connector with a second encapsulant, and forming a first redistribution structure over the first die, the second die, the first encapsulant, the second encapsulant, and the electrical connector, the first redistribution structure being electrically coupled to the first conductive pillar and the electrical connector. The method further including removing the carrier substrate, and bonding a second package to the electrical connector of the first package using a first conductive connector, the second package being proximate the first die. The method where forming the first package further includes forming a via in the first die, encapsulating the first die and the second die with a first encapsulant, forming an electrical connector over a carrier substrate, attaching the encapsulant and bonded first and second dies to the carrier substrate adjacent the electrical connector, the second die being adjacent the carrier substrate, encapsulating the bonded first and second dies, the first encapsulant, and the electrical connector with a second encapsulant, planarizing the encapsulant, where after planarizing the electrical connector and the via in the first die are exposed, forming a first redistribution structure over the first die, the second die, the first encapsulant, the second encapsulant, and the electrical connector, the first redistribution structure being electrically coupled to the via in the first die and the electrical connector, and forming conductive connectors over and electrically coupled to the first redistribution structure. The method where the first insulating layer and the second insulating layer are both made of a polymer. The method where the first insulating layer and the second insulating layer are both made of silicon nitride, silicon oxide, phosphosilicate glass (PSG), borosilicate glass (BSG), boron-doped phosphosilicate glass (BPSG), or a combination thereof.

In an embodiment, a method includes forming a first insulating layer over a first side of a first wafer, patterning a recess in the first insulating layer, conformally depositing a conductive material in the recess and over the first insulating layer, a thickness of the conductive material being less than a thickness of the first insulating layer, removing portions of the conductive material outside of the recess to form a first bond pad, the first bond pad and the first insulating layer being on a first active side of a first die in the first wafer, forming a second die including a second active side, the second active side including a second bond pad and a second insulating layer, forming a conductive bump on the second bond pad, the conductive bump having a reflow temperature lower than reflow temperatures of the first and second bond pads, bonding the conductive bump on the second bond pad to the first bond pad; and bonding the second insulating layer of the second die to the first insulating layer.

Embodiments may include one or more of the following features. The method further including forming a first conductive pillar on and electrically coupled to a third bond pad on the first active side of the first die; encapsulating the first wafer, the second die, and the first conductive pillar with a first encapsulant, and singulating the first wafer and the first encapsulant, the singulating forming a first package structure including the first die, the second die, the first conductive pillar, and the first encapsulant. The method further including forming an electrical connector over a carrier substrate, attaching the first package structure to the carrier substrate adjacent the electrical connector, the first die being adjacent the carrier substrate; encapsulating the first package structure and the electrical connector with a second encapsulant; and forming a first redistribution structure over the first package structure, the second encapsulant, and the electrical connector, the first redistribution structure being electrically coupled to the first conductive pillar and the electrical connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first package structure comprising:
        a first die having a first active side and a first back-side, the first active side comprising a first bond pad and a first insulating layer;
        a second die bonded to the first die, the second die having a second active side and a second back-side, the second active side comprising a second bond pad and a second insulating layer, the second active side of the second die facing the first active side of the first die, the second insulating layer spaced apart from the first insulating layer;
        a conductive bonding material bonded to the first bond pad and the second bond pad, the conductive bonding material having a reflow temperature lower than reflow temperatures of the first bond pad and the second bond pad;
        a sealing layer on the first active side of the first die and on a sidewall of the second die, the sealing layer sealing a gap between the first insulating layer and the second insulating layer; and
        a first encapsulant on the sealing layer.

2. The package of claim 1, wherein the first bond pad is recessed into the first insulating layer.

3. The package of claim 1, wherein the first active side of the first die further comprises a conductive pad, and the first package structure further comprises:
    a first through via electrically coupled to the conductive pad, the sealing layer on a sidewall of the first through via.

4. The package of claim 3 further comprising:
    a second through via adjacent the first package structure;
    a second encapsulant encapsulating the second through via and the first package structure, the second through via extending through the second encapsulant; and
    a redistribution structure on the second encapsulant, the redistribution structure being electrically coupled to the first through via and to the second through via.

5. The package of claim 4 further comprising:
    a second package structure bonded to the second through via, the first package structure disposed between the second package structure and the redistribution structure.

6. The package of claim 1, wherein the first bond pad has a vertical portion and a horizontal portion, the vertical portion extending along a sidewall of the first insulating layer, the horizontal portion recessed from the vertical portion, the conductive bonding material being separated from the vertical portion by a void.

7. The package of claim 1, wherein the conductive bonding material comprises a solder material, and wherein the first bonding pad and the second bonding pad comprise copper or aluminum.

8. The package of claim 1, wherein the sealing layer comprises a same material as the second insulating layer.

9. A package comprising:
    a first die comprising a first bond pad and a first insulating layer around the first bond pad, the first bond pad having a vertical portion and a horizontal portion, the vertical portion extending along a sidewall of the first insulating layer, the horizontal portion recessed from the vertical portion;
    a second die comprising a second bond pad and a second insulating layer around the second bond pad, the second insulating layer separated from the first insulating layer;
    a conductive bonding material bonded to the first bond pad and the second bond pad, the conductive bonding material contacting the horizontal portion of the first bond pad, the conductive bonding material being separated from the vertical portion of the first bond pad by a void; and
    a sealing layer sealing a bonding interface between the first die and the second die.

10. The package of claim 9, wherein the sealing layer comprises a same material as the second insulating layer.

11. The package of claim 9, wherein the sealing layer comprises a polymer.

12. The package of claim 9, wherein the sealing layer comprises silicon nitride, silicon oxide, phosphosilicate glass (PSG), borosilicate glass (BSG), boron-doped phosphosilicate glass (BPSG), or a combination thereof.

13. The package of claim 9, wherein the first die further comprises a metallization layer, and the first bond pad comprises:
    a seed layer on a portion of the metallization layer;
    a barrier layer on the seed layer; and
    a conductive layer on the barrier layer.

14. The package of claim 13, wherein the conductive bonding material has a lower reflow temperature than each of the conductive layer and the second bond pad.

15. A method comprising:
    forming a first package structure comprising:
        bonding a first side of a first die to a second side of a second die with a conductive bonding material, the first side comprising a first bond pad and a first insulating layer, the second side comprising a second bond pad and a second insulating layer, the second side of the second die facing the first side of the first die, the second insulating layer separated from the first insulating layer by a gap, the conductive bonding material bonded to the first bond pad and the second bond pad, the conductive bonding material having a reflow temperature lower than reflow temperatures of the first bond pad and the second bond pad;
        sealing the gap between the first insulating layer and the second insulating layer by forming a sealing layer over the first die and the second die; and
        forming a first encapsulant over the sealing layer.

16. The method of claim 15 further comprising:
    forming an electrical connector over a carrier substrate;
    attaching the first package structure to the carrier substrate adjacent the electrical connector;

encapsulating the first package structure and the electrical connector with a second encapsulant; and forming a first redistribution structure over the first package structure, the second encapsulant, and the electrical connector, the first redistribution structure being electrically coupled to the electrical connector.

17. The method of claim 16, wherein the second die comprises a through via and the first redistribution structure is electrically coupled to the through via.

18. The method of claim 16 further comprising:
removing the carrier substrate; and
bonding a second package to the electrical connector, the second package being proximate the first die.

19. The method of claim 15, wherein forming the sealing layer comprises depositing an insulating material over the first die and the second die.

20. The method of claim 15, wherein forming the sealing layer comprises coating a polymer material over the first die and the second die.

* * * * *